US012796143B2

(12) United States Patent
Shirahige

(10) Patent No.: US 12,796,143 B2
(45) Date of Patent: Nov. 10, 2026

(54) PHOTOELECTRIC CONVERSION APPARATUS, METHOD FOR MANUFACTURING THE SAME, AND EQUIPMENT

(71) Applicant: CANON KABUSHIKI KAISHA, Tokyo (JP)

(72) Inventor: Daiki Shirahige, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 494 days.

(21) Appl. No.: 18/341,456

(22) Filed: Jun. 26, 2023

(65) Prior Publication Data

US 2024/0006447 A1 Jan. 4, 2024

(30) Foreign Application Priority Data

Jun. 29, 2022 (JP) ................................ 2022-104632
Apr. 12, 2023 (JP) ................................ 2023-064769

(51) Int. Cl.
*H10F 39/00* (2025.01)
*H10H 29/14* (2025.01)

(52) U.S. Cl.
CPC ..... *H10F 39/807* (2025.01); *H10F 39/80373* (2025.01); *H10F 39/8053* (2025.01); *H10F 39/8063* (2025.01); *H10H 29/142* (2025.01)

(58) Field of Classification Search
CPC .... H10F 39/199; H10F 39/802; H10F 39/803; H10F 39/8037; H10F 39/80373;
(Continued)

(56) References Cited

U.S. PATENT DOCUMENTS

2014/0340541 A1* 11/2014 Shimotsusa ............. H10F 39/18
348/222.1
2016/0086984 A1* 3/2016 Wang .................... H10F 39/812
257/292

(Continued)

FOREIGN PATENT DOCUMENTS

CN 113921549 A * 1/2022 ............. H10F 39/18
CN 115548040 A * 12/2022 ............. H10F 39/18

(Continued)

*Primary Examiner* — Matthew E Warren
(74) *Attorney, Agent, or Firm* — Canon U.S.A., Inc. IP Division

(57) ABSTRACT

A photoelectric conversion apparatus includes a pixel having first and second surfaces and including photoelectric conversion elements, a charge accumulation region arranged in each of the elements and configured to accumulate signal charge, a transfer gate arranged on the first surface and configured to transfer the signal charge, a floating diffusion (FD) portion arranged between the elements in a plan view from a first surface side, and a charge leak region arranged between the elements and being in contact with the elements in the plan view. The charge leak region and the charge accumulation region have the same conductivity type. The FD portion is at a first depth from the first surface. The charge leak region is at a second depth deeper than the first depth from the first surface. In the plan view, the charge leak region is at a position overlapping at least part of the FD portion.

5 Claims, 22 Drawing Sheets

CROSS SECTION A-B

(58) Field of Classification Search
CPC ............. H10F 39/8053; H10F 39/8063; H10F 39/807; H10H 29/142
See application file for complete search history.

(56) References Cited

U.S. PATENT DOCUMENTS

| | | | | |
|---|---|---|---|---|
| 2018/0374886 | A1* | 12/2018 | Iwata | H10F 30/28 |
| 2024/0079423 | A1* | 3/2024 | Chen | H10F 39/807 |

FOREIGN PATENT DOCUMENTS

| | | | | |
|---|---|---|---|---|
| JP | 2013149743 A | | 8/2013 | |
| JP | 2014116472 A | | 6/2014 | |
| JP | 2022114224 A | | 8/2022 | |
| WO | WO-2019106983 A1 | * | 6/2019 | H10D 62/109 |
| WO | WO-2023106156 A1 | * | 6/2023 | H10F 39/182 |

* cited by examiner

CROSS SECTION A-B

CROSS SECTION A-B

CROSS SECTION A-B

CROSS SECTION A-B

CROSS SECTION A-B

CROSS SECTION A-B

CROSS SECTION A-B

CROSS SECTION A-B

CROSS SECTION A-B

CROSS SECTION I-J

PHOTOELECTRIC CONVERSION APPARATUS, METHOD FOR MANUFACTURING THE SAME, AND EQUIPMENT

BACKGROUND

Technical Field

The aspect of the embodiments relates to a photoelectric conversion apparatus, a method for manufacturing the photoelectric conversion apparatus, and equipment.

Description of the Related Art

In a case where signals output from a plurality of photoelectric conversion elements are used as one signal in a photoelectric conversion apparatus, if generated signal charge amounts vary between the plurality of photoelectric conversion elements, an appropriate signal may fail to be obtained. To address this issue, a signal charge leak region can be arranged between a plurality of photoelectric conversion elements to obtain an appropriate signal, as discussed in Japanese Patent Application Laid-Open No. 2013-149743.

However, in a case where a signal charge leak region is arranged as discussed in Japanese Patent Application Laid-Open No. 2013-149743, a pixel area can increase.

SUMMARY

According to an aspect of the embodiments, a photoelectric conversion apparatus includes a pixel having a first surface and a second surface and including an array of a plurality of photoelectric conversion elements, a charge accumulation region arranged in each of the plurality of photoelectric conversion elements and configured to accumulate signal charge, a transfer gate arranged on the first surface and configured to transfer the signal charge output from at least a corresponding one of the plurality of photoelectric conversion elements, a floating diffusion portion arranged between the plurality of photoelectric conversion elements in a plan view from a side of the first surface, and a first charge leak region arranged between the plurality of photoelectric conversion elements and being in contact with the plurality of photoelectric conversion elements in the plan view from the side of the first surface. The first charge leak region has a same conductivity type as a conductivity type of the charge accumulation region. The floating diffusion portion is arranged at a first depth from the first surface. The first charge leak region is arranged at a second depth deeper than the first depth from the first surface. In the plan view from the side of the first surface, the first charge leak region is arranged at a position overlapping at least a part of the floating diffusion portion.

Further features of the disclosure will become apparent from the following description of exemplary embodiments with reference to the attached drawings.

DESCRIPTION OF THE EMBODIMENTS

Figure 1:
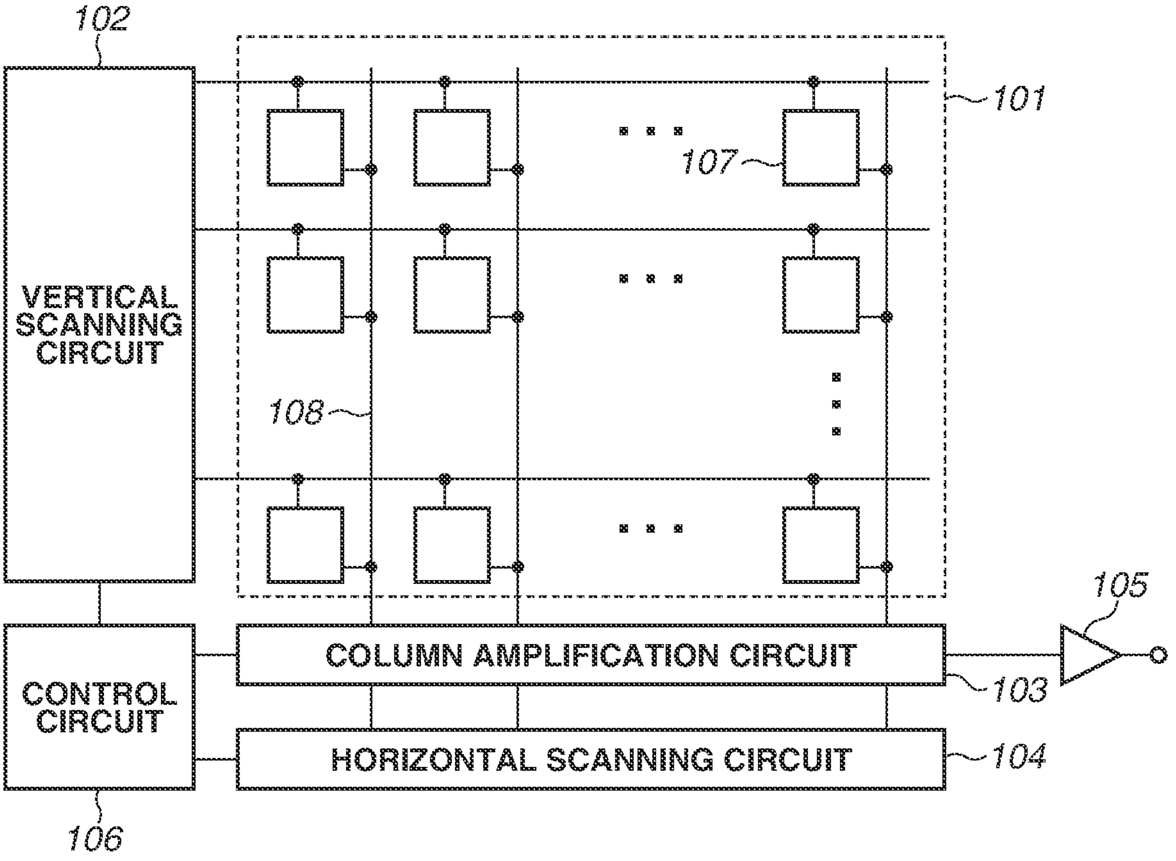
FIG. 1 is a block diagram illustrating a photoelectric conversion apparatus according to a first exemplary embodiment.

Hereinafter, exemplary embodiments will be described with reference to the attached drawings. The following exemplary embodiments are not intended to limit the disclosure set forth in the appended claims. A plurality of features is described in the exemplary embodiments, but not all the plurality of features are essential to the disclosure, and the plurality of features can be combined as appropriate. In the attached drawings, the same or similar components are assigned the same reference numerals, and the redundant description thereof will be omitted. In the following exemplary embodiments, a complementary metal-oxide semiconductor (CMOS) sensor will be mainly described as an example of a photoelectric conversion apparatus. However, the photoelectric conversion apparatus according to each of the exemplary embodiments is not limited to the CMOS sensor, and each of the exemplary embodiments can be applied to other types of photoelectric conversion apparatuses. For example, each of the exemplary embodiments can be applied to a charge-coupled device (CCD) sensor, an imaging apparatus, a distance measurement apparatus (an apparatus for measuring a distance using focus detection or time of flight (TOF)), and a photometric apparatus (an apparatus for measuring an incident light amount).

In this specification, terms indicating specific directions or positions (e.g., “up”, “down”, “right”, “left” and other terms including these terms) are used as appropriate. These terms are used to facilitate the understanding of the exemplary embodiments to be described with reference to the drawings, and the technical scope of the disclosure is not limited by the meanings of these terms.

In this specification, a “plane surface” refers to a surface extending in a direction parallel to a principal surface of a semiconductor substrate.

The principal surface of a semiconductor substrate can be a light incidence surface of a semiconductor substrate including a photoelectric conversion element, a surface on which a plurality of analog-to-digital converters (ADCs) is repeatedly arranged, or a bonded surface of substrates of a laminated photoelectric conversion apparatus.

A “plan view” refers to a view from a direction vertical to the principal surface of a semiconductor substrate. A “cross section” refers to a surface extending in a direction vertical to the light incidence surface of a semiconductor layer. A “cross-sectional view” refers to a view from a direction parallel to the principal surface of a semiconductor substrate.

In this specification, an impurity concentration of each semiconductor region is not a concentration corresponding to the amount of an impurity actually implanted by ion implantation, but a concentration of an impurity that contributes to behavior as a semiconductor region of a predetermined conductivity type. In other words, the impurity concentration refers to a concentration corresponding to a difference between a donor concentration and an acceptor concentration, and the impurity concentration is called a net doping concentration. For example, in a case where an impurity (a donor) for making a semiconductor region into an N-type semiconductor region is included in a semiconductor region behaving as a P-type semiconductor region, a concentration of the impurity (the donor) for making a semiconductor region into an N-type semiconductor region is subtracted from a concentration of an impurity (an acceptor) for making a semiconductor region into a P-type semiconductor region. Then, a concentration obtained by the subtraction is regarded as the impurity concentration for making the semiconductor region into a semiconductor region of a predetermined conductivity type.

A configuration of a photoelectric conversion apparatus according to a first exemplary embodiment of the disclosure will be described with reference to FIGS. 1 to 7.

FIG. 1 is a block diagram illustrating an example of a schematic configuration of a photoelectric conversion apparatus according to the present exemplary embodiment. The photoelectric conversion apparatus includes a pixel array 101, a vertical scanning circuit 102, a column amplification circuit 103, a horizontal scanning circuit 104, an output circuit 105, and a control circuit 106. The photoelectric conversion apparatus is a semiconductor apparatus formed on a semiconductor substrate such as a silicon substrate.

The pixel array 101 includes a plurality of pixels 107 arranged on a semiconductor substrate in a two-dimensional array including a plurality of rows and a plurality of columns. The vertical scanning circuit 102 supplies a plurality of control signals for controlling a plurality of transistors in the pixels 107 to be turned on (enter a conductive state) or turned off (enter a non-conductive state). A column signal line 108 is provided for each column of the pixels 107, and signals from the pixels 107 are read out to the column signal line 108 on a column-by-column basis. The column amplification circuit 103 amplifies the pixel signals output by the column signal line 108, and performs processing such as correlated double sampling processing that is based on signals at the time of reset of the pixels 107 and signals at the time of photoelectric conversion. A switch is connected to an amplifier of the column amplification circuit 103, and the horizontal scanning circuit 104 supplies a control signal for controlling the switch to be turned on or off. The control circuit 106 controls the vertical scanning circuit 102, the column amplification circuit 103, and the horizontal scanning circuit 104. The output circuit 105 includes a buffer amplifier and a differential amplifier, and outputs the pixel signals from the column amplification circuit 103 to a signal processing unit outside the photoelectric conversion apparatus. The photoelectric conversion apparatus can further include an analog-to-digital (AD) conversion unit to output digital pixel signals.

Figure 2:
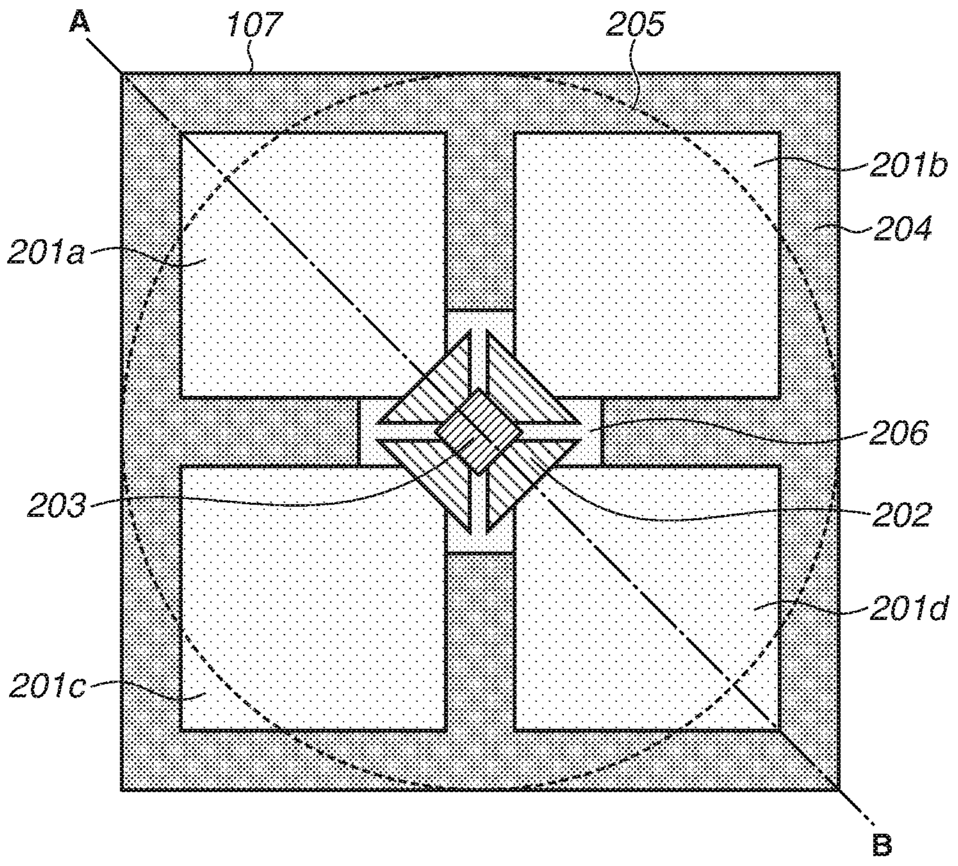
FIG. 2 is a plan view illustrating the photoelectric conversion apparatus according to the first exemplary embodiment.

FIG. 2 is a plan view illustrating an example of each pixel 107. As described below with reference to FIG. 3A, each pixel 107 has a first surface 207 and a second surface 208. FIG. 2 is a plan view of each pixel 107 viewed from the first surface 207 side.

As illustrated in FIG. 2, in each pixel 107, a plurality of photoelectric conversion elements 201*a*, 201*b*, 201*c*, and 201*d* is arranged to share a microlens 205. The plurality of photoelectric conversion elements 201*a*, 201*b*, 201*c*, and 201*d* may not necessarily share the same microlens 205. In a case where the plurality of photoelectric conversion elements 201*a*, 201*b*, 201*c*, and 201*d* does not share the same microlens 205, a plurality of the microlenses 205 respectively corresponding to the plurality of photoelectric conversion elements 201*a*, 201*b*, 201*c*, and 201*d* is arranged, for example. In a case where the plurality of photoelectric conversion elements 201*a*, 201*b*, 201*c*, and 201*d* is generally described, the photoelectric conversion elements 201*a*, 201*b*, 201*c*, and 201*d* will be referred to as the photoelectric conversion elements 201.

In FIG. 2, transfer gates 202 respectively corresponding to the plurality of photoelectric conversion elements 201 are arranged. In the plan view from the first surface 207 side, a floating diffusion (FD) portion 203, an element isolation region 204, and a first charge leak region 206 are arranged between the plurality of photoelectric conversion elements 201.

The transfer gates 202 are arranged to be adjacent to the FD portion 203, and transfers signal charge output from the plurality of photoelectric conversion elements 201 to the FD portion 203. The plurality of photoelectric conversion elements 201 is isolated by the element isolation region 204. The FD portion 203 can be shared by the plurality of photoelectric conversion elements 201, or a plurality of the FD portions 203 respectively corresponding to the plurality of photoelectric conversion elements 201 can be provided.

The first charge leak region 206 is arranged to be in contact with the plurality of photoelectric conversion elements 201. In the plan view from the first surface 207 side, the first charge leak region 206 is arranged at a position overlapping at least a part of the FD portion 203 belonging to the same pixel 107. In the plan view from the first surface 207 side, the first charge leak region 206 is also arranged at a position overlapping at least a part of each of the plurality of photoelectric conversion elements 201 belonging to the same pixel 107.

While FIG. 2 illustrates a configuration in which four photoelectric conversion elements 201 are arranged in one pixel 107, the number of the photoelectric conversion elements 201 may not necessarily be four. While FIG. 2 also illustrates a configuration in which four transfer gates 202 are arranged in one pixel 107, the number of the transfer gates 202 may not necessarily be four, similarly to the photoelectric conversion elements 201.

Figure 3A:
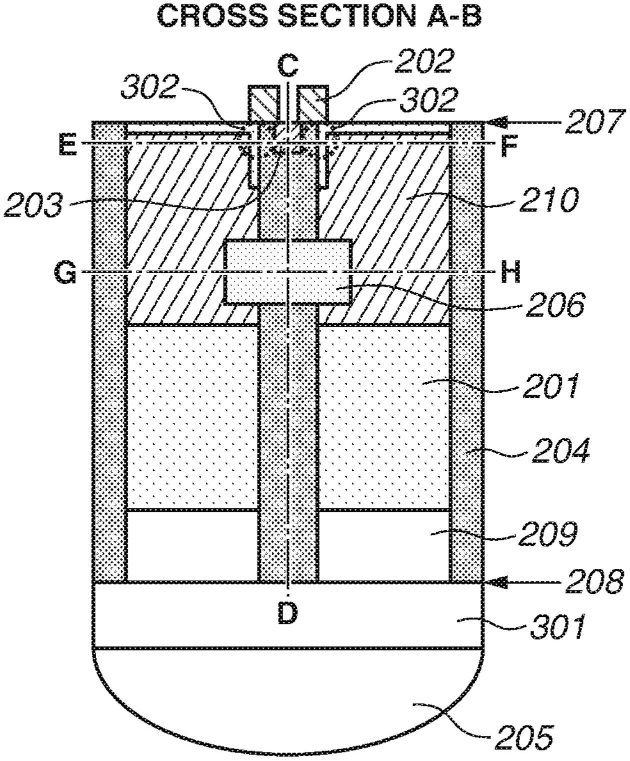
FIGS. 3A and 3B are cross-sectional views illustrating the photoelectric conversion apparatus according to the first exemplary embodiment.

FIG. 3A is a cross-sectional view illustrating an example of a cross section of each pixel 107 taken along a line A-B in the plan view of FIG. 2. FIG. 3A illustrates a back-illuminated structure in which each pixel 107 has the first surface 207 and the second surface 208 and the second surface 208 serves as the light incidence surface. The present exemplary embodiment is not limited to the back-illuminated structure and can be applied to a front-illuminated structure in which the first surface 207 serves as the light incidence surface.

The plurality of photoelectric conversion elements 201 is arranged in a semiconductor substrate 209, and the element isolation region 204 is arranged between the plurality of photoelectric conversion elements 201. The transfer gates 202 are each arranged on the first surface 207 to be adjacent to the corresponding photoelectric conversion element 201 and the FD portion 203. The FD portion 203, a part of the element isolation region 204, the first charge leak region 206, and another part of the element isolation region 204 are arranged in order from the first surface 207 to the second surface 208. On the second surface 208, a color filter 301 and the microlens 205 are arranged in order from the second surface 208 side. In the case of the front-illuminated structure, the color filter 301 and the microlens 205 are arranged on the first surface 207 in order from the first surface 207 side. The plurality of photoelectric conversion elements 201 may or may not share the color filter 301. In a case where the plurality of photoelectric conversion elements 201 shares the color filter 301, for example, four photoelectric conversion elements 201 can share one color filter 301, or each pair of two photoelectric conversion elements 201 can share one color filter 301. In a case where the plurality of photoelectric conversion elements 201 does not share the color filter 301, for example, a plurality of the color filters 301 of the same color respectively corresponding to the plurality of photoelectric conversion elements 201 is arranged. The microlens 205 and the color filter 301 may not necessarily be arranged.

A region adjacent to each of the transfer gates 202 and included in the element isolation region 204 and the corresponding photoelectric conversion element 201 is called a semiconductor region 302 below the transfer gate 202. The semiconductor region 302 below the transfer gate 202 indicates a region through which signal charge passes when moving from the photoelectric conversion element 201 to the FD portion 203.

The photoelectric conversion elements 201 each include a charge accumulation region 210 having a conductivity type that can accumulate signal charge generated by photoelectric conversion. The element isolation region 204 is formed with a conductivity type opposite to that of the charge accumulation region 210. The height of a potential barrier of the first charge leak region 206 with respect to the signal charge is lower than the height of a potential barrier of the element isolation region 204 with respect to the signal charge. In other words, in the present exemplary embodiment, the first charge leak region 206 is of a first conductivity type that is the same conductivity type as that of the charge accumulation region 210, and the element isolation region 204 is of a second conductivity type different from that of the charge accumulation region 210. For example, in a case where the signal charge is electrons, the charge accumulation region 210 and the first charge leak region 206 are formed into N-type regions, and the element isolation region 204 is formed into a P-type region. The first charge leak region 206 may or may not be in contact with the charge accumulation region 210.

The FD portion 203 is arranged at a first depth from the first surface 207, and the first charge leak region 206 is arranged at a second depth from the first surface 207. The second depth is deeper than the first depth, and the first charge leak region 206 is not contact with the FD portion 203.

As described above, by arranging the first charge leak region 206 at a depth different from the depth of the FD portion 203 in each pixel 107, the first charge leak region 206 can be arranged at a position overlapping the FD portion 203 in the plan view from the first surface 207 side. Thus, in a case where the first charge leak region 206 is arranged in each pixel 107, the degree of freedom in arranging the first charge leak region 206 improves, and layout restrictions due to pixel miniaturization are eased. In other words, arranging the first charge leak region 206 at a position overlapping the FD portion 203 can suppress an increase in pixel area.

As the number of the photoelectric conversion elements 201 sharing the first charge leak region 206 increases, the number of the first charge leak regions 206 to be arranged also increases. Also in this case, in the present exemplary embodiment, the first charge leak regions 206 can be arranged without being significantly affected by a semiconductor element arranged on the first surface 207 side. Thus, the degree of layout freedom in arranging a semiconductor element in each pixel 107 improves.

For example, a case where the sum of the signal charge generated in the photoelectric conversion elements 201*a*, 201*b*, 201*c*, and 201*d* arranged in two rows and two columns as illustrated in FIG. 2 is used as a photoelectric conversion signal will now be considered. In this case, it is easy to arrange a charge leak region between the photoelectric conversion elements 201 adjacent in the column direction, such as the photoelectric conversion elements 201*a* and 201*c* or the photoelectric conversion elements 201*b* and 201*d*. It is also easy to arrange a charge leak region between the photoelectric conversion elements 201 adjacent in the row direction, such as the photoelectric conversion elements 201*a* and 201*b* or the photoelectric conversion elements 201*c* and 201*d*. However, it is not relatively easy to arrange a charge leak region between the photoelectric conversion elements 201 not adjacent in the row direction or the column direction but adjacent in, for example, a diagonal direction, due to the influence of another semiconductor element such as the FD portion 203. As an example of the photoelectric conversion elements 201 not adjacent in the row direction or the column direction but adjacent in, for example, the diagonal direction, a combination of the photoelectric conversion elements 201*a* and 201*d* or a combination of the photoelectric conversion elements 201*b* and 201*c* is conceivable.

In the present exemplary embodiment, because the first charge leak region 206 can be arranged without being affected by the arrangement of a semiconductor element, such as the FD portion 203, in each pixel 107, it is also possible to easily arrange the first charge leak region 206 between the photoelectric conversion elements 201 not adjacent in the row direction or the column direction. For example, compared with a case where a charge leak region exists only in the row direction or the column direction, arranging the first charge leak region 206 in the diagonal direction provides a larger number of destinations to which the signal charge leaks when saturated by incidence of intense light into one of the photoelectric conversion elements 201. It is thus possible to further suppress an influence on the linearity of a pixel input-output characteristic under high illuminance.

While in the present exemplary embodiment, the description has been given of a case where one pixel 107 includes the photoelectric conversion elements 201 arranged in two rows and two columns, the photoelectric conversion elements 201 may not necessarily be arranged in two rows and two columns. Aside from the two-row and two-column arrangement, the photoelectric conversion elements 201 can be arranged in one row and two columns, or three rows and three columns.

Figure 3B:
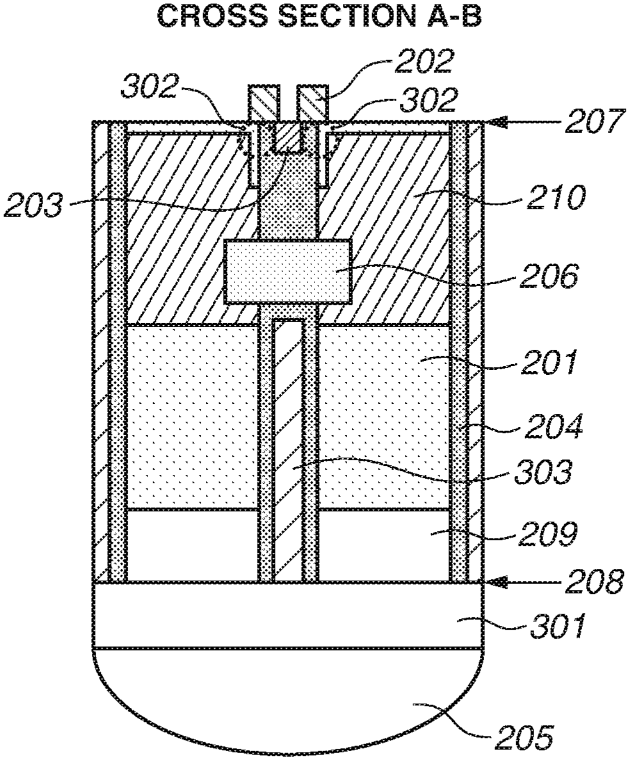

FIG. 3B is a cross-sectional view illustrating an example of the cross section of each pixel 107 taken along the line A-B in the plan view of FIG. 2, which is different from the example illustrated in FIG. 3A.

As illustrated in FIG. 3B, the element isolation region 204 arranged between the plurality of photoelectric conversion elements 201 that share the first charge leak region 206 includes a trench structure 303. The trench structure 303 can contain at least either of insulating material and metal. For example, in a case where the signal charge is electrons, the element isolation region 204 is formed into a P-type region, and the trench structure 303 buried inside the element isolation region 204 exists up to the depth of the first charge leak region 206 from the second surface 208 on the light incidence side. In other words, the FD portion 203, a part of the element isolation region 204, the first charge leak region 206, another part of the element isolation region 204, and the trench structure 303 are arranged in order from the first surface 207 to the second surface 208.

The element isolation region 204 arranged between the photoelectric conversion elements 201 that do not share the first charge leak region 206 can also include the trench structure 303. In this case, the trench structure 303 is arranged to penetrate through the first surface 207 and the second surface 208.

Figure 4:
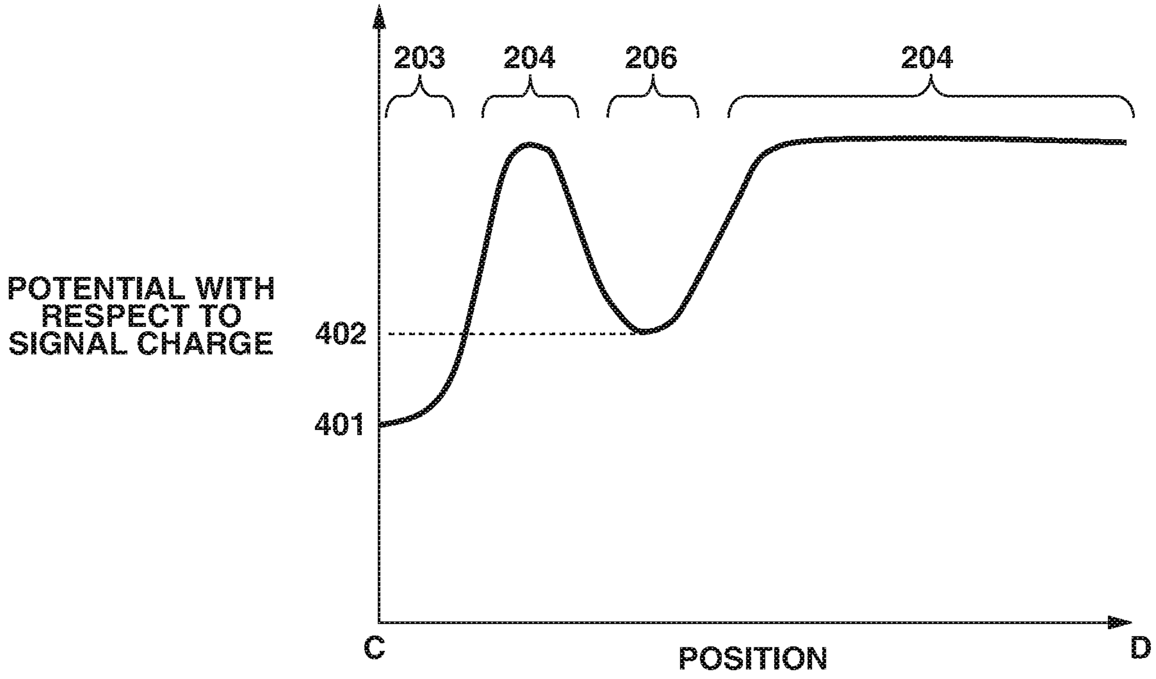
FIG. 4 is a potential diagram illustrating potentials with respect to signal charge in the photoelectric conversion apparatus according to the first exemplary embodiment.

FIG. 4 is a potential diagram illustrating an example of potentials with respect to the signal charge in a cross section C-D taken along a line C-D in the cross-sectional view of FIG. 3A. A relationship among potentials of the FD portion 203, the element isolation region 204, and the first charge leak region 206 with respect to the signal charge will be described with reference to FIG. 4.

As illustrated in FIG. 4, a second potential 402, which is the potential of the first charge leak region 206, is higher than a first potential 401, which is the potential of the FD portion 203, and lower than the potential of the element isolation region 204.

Assume that, in a case where the sum of the signal charge generated in the plurality of photoelectric conversion elements 201 is used as a photoelectric conversion signal, the signal charge of one of the photoelectric conversion elements 201 is saturated by incidence of intense light. In this case, the amount of signal charge moving between the photoelectric conversion elements 201 via the first charge leak region 206 is larger than the amount of signal charge moving between the photoelectric conversion elements 201 via the element isolation region 204. Thus, the signal charge can be leaked via the first charge leak region 206 to another photoelectric conversion element 201 that shares the first charge leak region 206. This can reduce the amount of signal charge overflowing to the FD portion 203 and increase the amount of signal charge that can be used. With the above-described configuration, in a case where the sum of the signal charge generated in the plurality of photoelectric conversion elements 201 is used as a photoelectric conversion signal, it is possible to suppress a decrease in the linearity of the pixel input-output characteristic.

In the present exemplary embodiment, the FD portion 203 and the first charge leak region 206 are arranged at overlapping positions in the plan view from the first surface 207 side, and arranged at different depths in the semiconductor substrate 209. Thus, as illustrated in FIG. 4, a potential barrier that blocks the movement of signal charge exists between the FD portion 203 and the first charge leak region 206.

For example, in a case where the signal charge is electrons, the FD portion 203 and the first charge leak region 206 are formed into N-type regions, and the element isolation region 204 is formed into a P-type region between the FD portion 203 and the first charge leak region 206. This provides a potential structure that blocks the movement of electrons between the FD portion 203 and the first charge leak region 206.

Figure 5A:
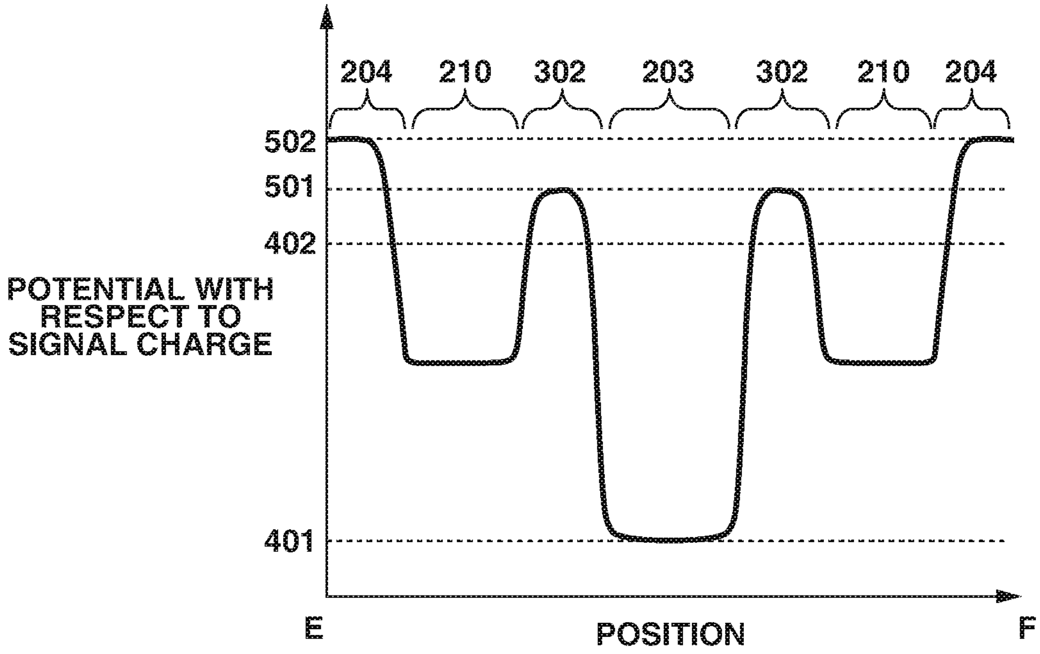
FIGS. 5A and 5B are other potential diagrams illustrating the potentials with respect to the signal charge in the photoelectric conversion apparatus according to the first exemplary embodiment.
Figure 5B:
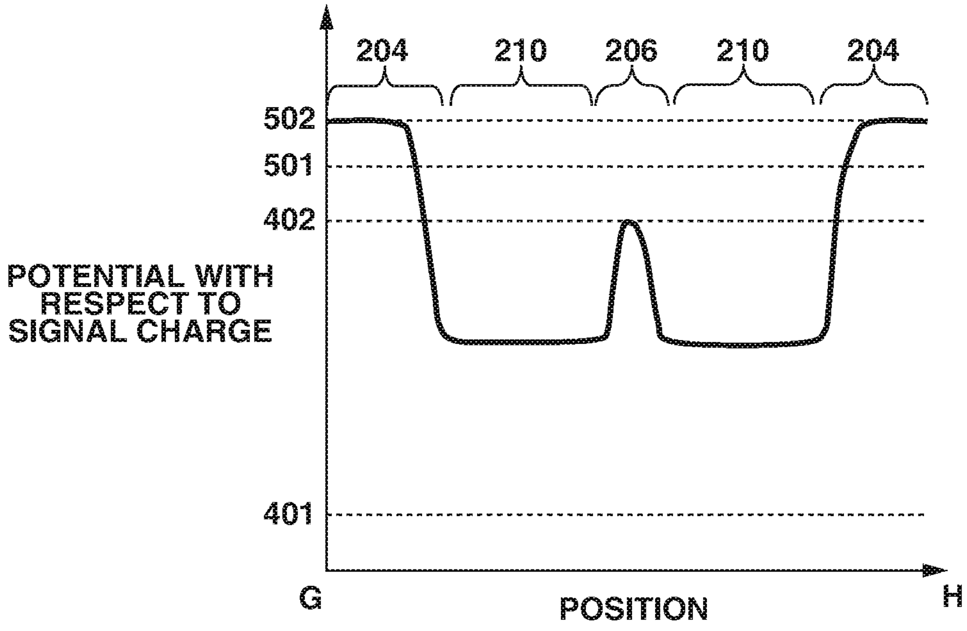

FIGS. 5A and 5B are potential diagrams each illustrating an example of the potentials with respect to the signal charge in cross sections E-F and G-H that are respectively taken along lines E-F and G-H in the cross-sectional view of FIG. 3A.

A relationship between the potentials of the element isolation region 204 and the semiconductor region 302 below the transfer gate 202 with respect to the signal charge will be described with reference to FIG. 5A. In the following description, a pixel adjacent to the pixel 107 via the element isolation region 204 and including a color filter of a color different from that of the color filter 301 will be referred to as a different color pixel.

In FIG. 5A, a third potential 501, which is the potential of the semiconductor region 302 below the transfer gate 202 that exists between the FD portion 203 and the photoelectric conversion element 201, is lower than a fourth potential 502, which is the potential of the element isolation region 204. Thus, the pixel 107 has a potential structure in which, in a case where the signal charge of any of the photoelectric conversion elements 201 (the charge accumulation regions 210) is saturated, the signal charge is more likely to be discharged to the FD portion 203 via the semiconductor region 302 below the transfer gate 202, rather than leaking to the different color pixel. It is consequently possible to prevent blooming, which is leakage of signal charge to the different color pixel.

A relationship among the potentials of the element isolation region 204, the first charge leak region 206, and the semiconductor region 302 below the transfer gate 202 with respect to the signal charge will be described with reference to FIG. 5B.

In FIG. 5B, the third potential 501 of the semiconductor region 302 below the transfer gate 202 is lower than the fourth potential 502, which is the potential of the element isolation region 204, and higher than the second potential 402 of the first charge leak region 206. Accordingly, the pixel 107 has a potential structure in which, in a case where the signal charge of any of the photoelectric conversion elements 201 (the charge accumulation regions 210) is saturated, the signal charge is likely to be discharged not only to the FD portion 203 but also to the first charge leak region 206.

In a case where the sum of the signal charge generated in the plurality of photoelectric conversion elements 201 is used as a photoelectric conversion signal, the linearity of the pixel output characteristic can deteriorate when an image of a high-illuminance subject is captured. For this reason, the above-described potential structure in which, in a case where the signal charge of any of the photoelectric conversion elements 201 is saturated, the signal charge leaks between the photoelectric conversion elements 201 is employed. As a result, a part of signal charge to be discharged to the FD portion 203 leaks to another adjacent photoelectric conversion element 201, which makes it possible to reduce deterioration of the linearity of the pixel output characteristic in high-illuminance image capturing.

Figure 6:
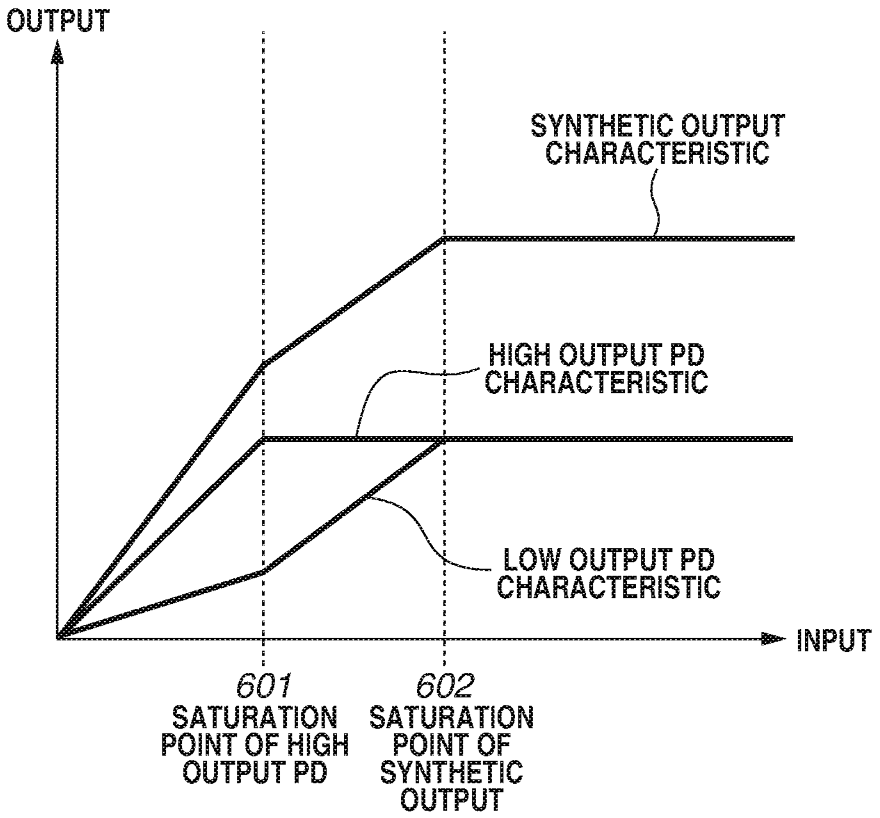
FIG. 6 is a diagram illustrating a pixel input-output characteristic of a photoelectric conversion apparatus according to a reference example.
Figure 7:
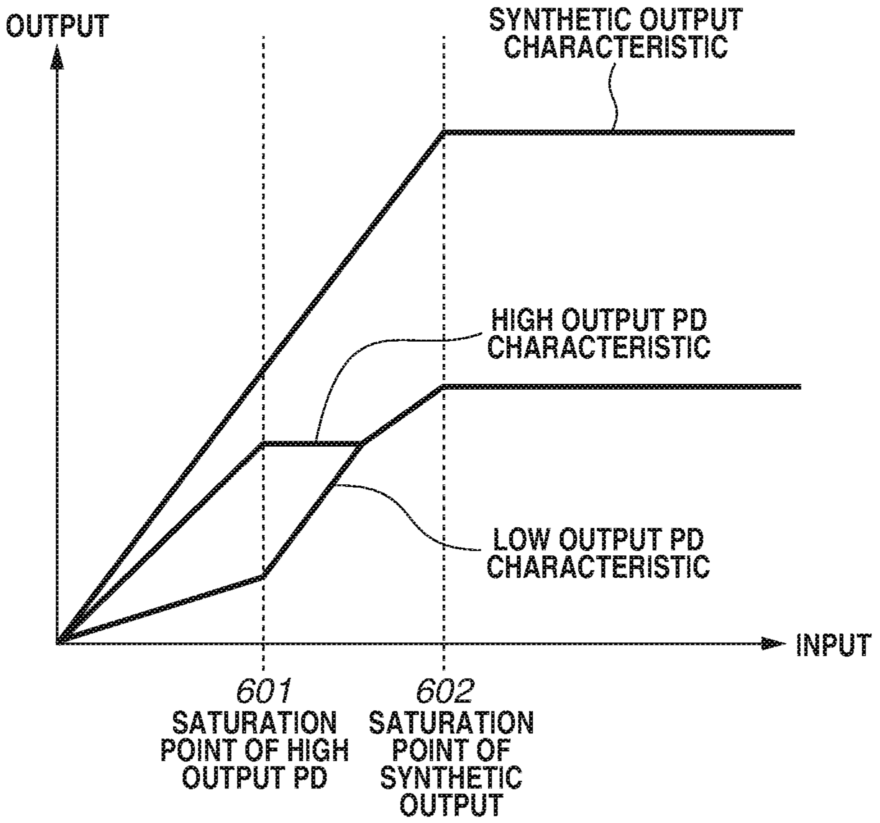
FIG. 7 is a diagram illustrating a pixel input-output characteristic of the photoelectric conversion apparatus according to the first exemplary embodiment.

FIGS. 6 and 7 each illustrate an example of the input-output characteristic of each pixel 107 that is obtainable in a case where the sum of the signal charge generated in two photoelectric conversion elements 201 is used as a photoelectric conversion signal. The input-output characteristic in a case where the signal charge of one of the photoelectric conversion elements 201 is saturated in a configuration not including the first charge leak region 206 will be described with reference to FIG. 6. An effect of improving the linearity of the input-output characteristic in a case where the signal charge of one of the photoelectric conversion element 201 is saturated by using a configuration including the first charge leak region 206 between the two photoelectric conversion elements 201 will be described with reference to FIG. 7. The input-output characteristic of the photoelectric conversion element 201 in which the signal charge is saturated will be referred to as a high output photodiode (PD) characteristic, and the input-output characteristic of the photoelectric conversion element 201 in which the signal charge is not saturated will be referred to as a low output PD characteristic. The sum of the high output PD characteristic and the low output PD characteristic will be referred to as a synthetic output characteristic.

For example, in the pixel 107 in which the plurality of photoelectric conversion elements 201 shares the same microlens 205, respective signals output from the photoelectric conversion elements 201 are to be processed for phase difference detection. At the same time, the respective signals output from the photoelectric conversion elements 201 are to be processed as signals to be used for image capturing. At this time, from the viewpoint of reduction of light shot noise relative to a signal amount, and a readout speed, the signals for image capturing are processed as one pixel signal by summing up the signal charge photoelectrically-converted by the plurality of photoelectric conversion elements 201 that shares the same microlens 205.

A case where a difference arises in the amount of generated signal charge due to a difference in incident light amount between two photoelectric conversion elements 201 in which the sum of the generated signal charge is used as a photoelectric conversion signal, and the amount of signal charge of one of the photoelectric conversion elements 201 has reached a saturation charge amount will now be considered. In this case, as illustrated in FIG. 6, a part of the signal charge is discharged to the FD portion 203, so that the linearity of the pixel input-output characteristic is lost at a saturation point 601 of the high output PD before a saturation point 602 of the synthetic output is reached.

By forming the potential structure as described with reference to FIGS. 5A and 5B, the following operation is executable. In a case where the amount of signal charge of one of the photoelectric conversion elements 201 has reached the saturation charge amount, excess signal charge leaks via the first charge leak region 206 to the other photoelectric conversion element 201 that shares the first charge leak region 206, and is accumulated therein. Thus, as illustrated in FIG. 7, the linearity of the pixel input-output characteristic at the saturation point 601 of the high output PD can be improved.

As described above, according to the present exemplary embodiment, it is possible to obtain an appropriate signal while suppressing an increase in pixel area, by arranging the first charge leak region 206 for improving the linearity of the pixel input-output characteristic, at a position overlapping the FD portion 203. For example, a configuration in which the first charge leak region 206 is shared by the photoelectric conversion elements 201 that share the same microlens 205 for phase difference detection will be considered. In the case of the above-described configuration, it is possible to obtain an appropriate signal when the sum of the signals of the photoelectric conversion elements 201 is used as an image capturing signal.

A method for manufacturing the photoelectric conversion apparatus according to the present exemplary embodiment will be described with reference to FIGS. 8 to 12.

Figure 8:
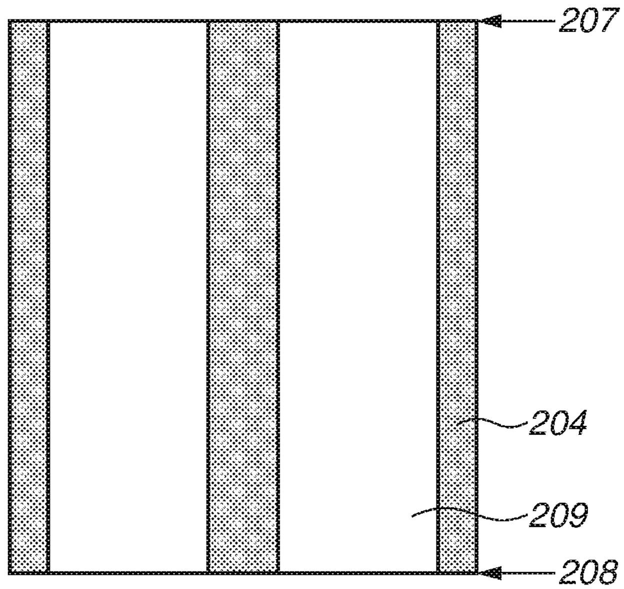
FIG. 8 is a cross-sectional view illustrating a method for manufacturing the photoelectric conversion apparatus according to the first exemplary embodiment.

FIG. 8 illustrates the formation of the element isolation region 204. The element isolation region 204 is formed by implanting ions into the semiconductor substrate 209. The element isolation region 204 is an impurity layer of a conductivity type different from that of the charge accumulation region 210, and is arranged between the photoelectric conversion elements 201 in order to prevent the signal charge from leaking between the photoelectric conversion elements 201. The trench structure 303 can be arranged in the element isolation region 204. Arranging the trench structure 303 therein enables preventing optical crosstalk. The details of the trench structure 303 will be described below. Instead of forming the element isolation region 204 using ion implantation, the element isolation region 204 can be formed by doping using solid-phase diffusion or the like during the formation of the trench structure 303. In this case, a shallow conformal impurity layer is formed as the element isolation region 204 along a side wall of the trench structure 303. This makes it possible to form a steep PN-junction and increase the number of saturated electrons also in a fine pixel structure.

Figure 9:
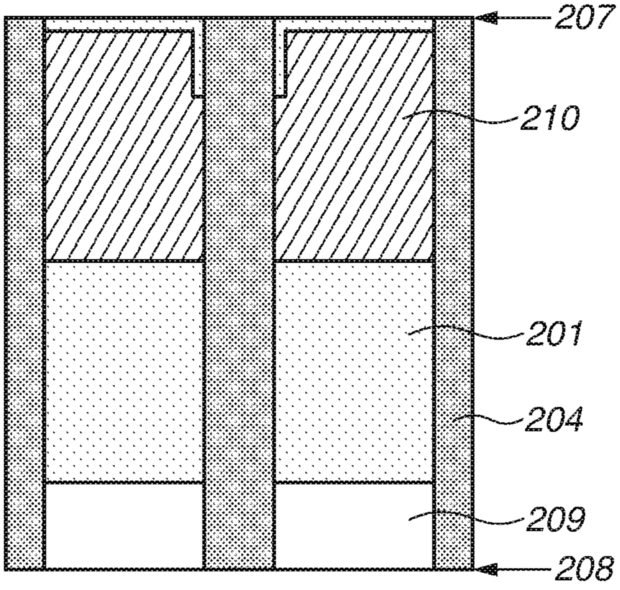
FIG. 9 is another cross-sectional view illustrating the method for manufacturing the photoelectric conversion apparatus according to the first exemplary embodiment.

Next, a method for manufacturing the charge accumulation region 210 and the first charge leak region 206 will be described with reference to FIGS. 9 and 10. As illustrated in FIG. 9, the charge accumulation region 210 is formed by ion implantation or the like. The size of a PN-junction area formed by the charge accumulation region 210 is one of factors in determining the number of saturated electrons in each pixel 107. In one embodiment, the charge accumulation region 210 is arranged in a region as wide as possible in each pixel 107. In a case where the pixel size is small, it is difficult to increase the PN-junction area in a plane direction of the semiconductor substrate 209. On the other hand, by increasing the PN-junction area between the charge accumulation region 210 and the element isolation region 204 in a depth direction of the semiconductor substrate 209, it is possible to increase the number of saturated electrons. For example, in a peripheral region of the charge accumulation region 210, an impurity of the same conductivity type as that of the charge accumulation region 210 is implanted by ion implantation at a concentration lower than that in the charge accumulation region 210. The charge accumulation region 210 and the peripheral region of the charge accumulation region 210 are regarded as each photoelectric conversion element 201. Alternatively, the peripheral region of the charge accumulation region 210 can include a region into which an impurity of a conductivity type different from that of the charge accumulation region 210 is implanted by ion implantation.

Figure 10:
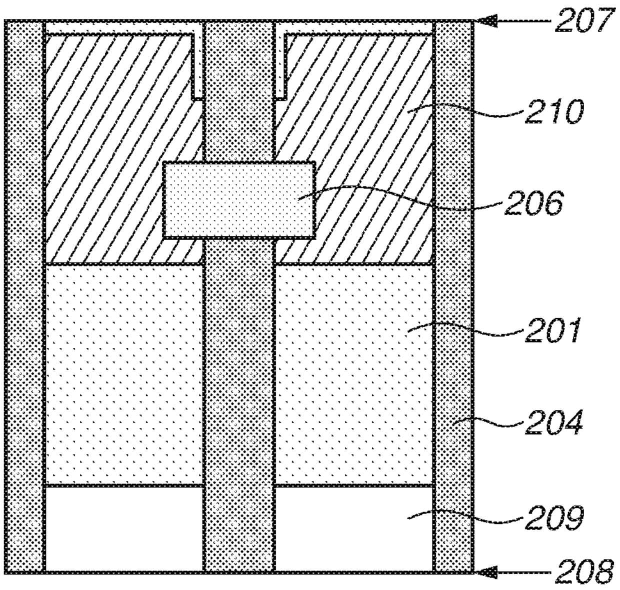
FIG. 10 is yet another cross-sectional view illustrating the method for manufacturing the photoelectric conversion apparatus according to the first exemplary embodiment.

As illustrated in FIG. 10, after the charge accumulation region 210 is formed, the first charge leak region 206 is formed by ion implantation or the like at a depth overlapping a part of the charge accumulation region 210. To simplify potential design of the first charge leak region 206, in one embodiment, the first charge leak region 206 is formed in a region at a depth at which the potential of the charge accumulation region 210 is lowest relative to the signal charge. The first charge leak region 206 is formed in the region in which the potential of the charge accumulation region 210 is lowest, whereby a potential barrier height at which the accumulated signal charge leaks to another region can be defined by the potential design of the first charge leak region 206. Thus, the potential design of the first charge leak region 206 is simplified.

On the other hand, by arranging the first charge leak region 206 at a position shifted from the position at which the potential of the charge accumulation region 210 is lowest relative to the signal charge, the signal charge can be controlled to leak after a predetermined amount of signal charge is accumulated in the charge accumulation region 210. For the purpose of obtaining a structure in which the signal charge is less likely to leak, the first charge leak region 206 can be arranged at a position shifted from the region in which the potential of the charge accumulation region 210 is lowest relative to the signal charge. In a case where the position of the first charge leak region 206 is shifted from the region in which the potential of the charge accumulation region 210 is lowest relative to the signal charge, the first charge leak region 206 is formed, for example, at a position shifted in the depth direction of the semiconductor substrate 209.

The conductivity type of the first charge leak region 206 can be any of the P-type and the N-type and the first charge leak region 206 can be a pure semiconductor region as long as the first charge leak region 206 can control the potential between the adjacent charge accumulation regions 210. The first charge leak region 206 is formed in the semiconductor substrate 209 by implanting an impurity of the same conductivity type as that of the charge accumulation region 210 by ion implantation or the like. In one embodiment, the first charge leak region 206 can be formed by reducing an ion implantation amount at a depth at which the first charge leak region 206 is to be formed, when the element isolation region 204 is formed.

Figure 11:
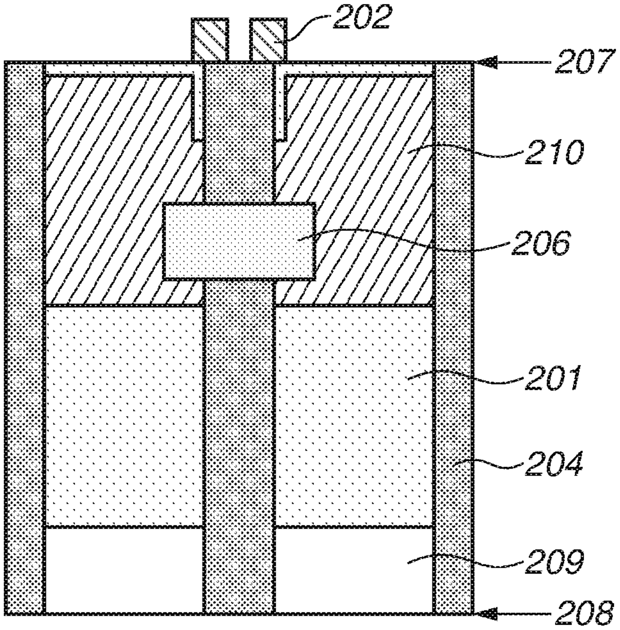
FIG. 11 is yet another cross-sectional view illustrating the method for manufacturing the photoelectric conversion apparatus according to the first exemplary embodiment.

Next, a method for manufacturing the transfer gates 202 and the FD portion 203 will be described with reference to FIGS. 11 and 12. As illustrated in FIG. 11, after the first charge leak region 206 is formed, each of the transfer gates 202 is formed at a position between the corresponding charge accumulation region 210 and the FD portion 203 in a plan view from the first surface 207 side of the semiconductor substrate 209. The transfer gates 202 contains polysilicon, for example.

Figure 12:
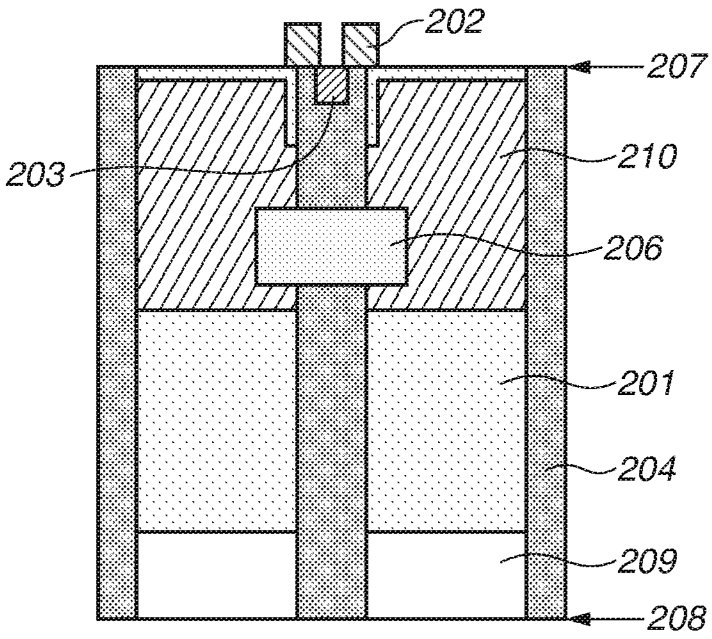
FIG. 12 is yet another cross-sectional view illustrating the method for manufacturing the photoelectric conversion apparatus according to the first exemplary embodiment.

As illustrated in FIG. 12, after the first charge leak region 206 and the transfer gates 202 are formed, the FD portion 203 is formed between the photoelectric conversion elements 201 that share the FD portion 203. For example, in a case where the photoelectric conversion elements 201 arranged in one row and two columns share the FD portion 203 in each pixel 107, the FD portion 203 is arranged at a position adjacent to the two photoelectric conversion elements 201. For example, in a case where the photoelectric conversion elements 201 arranged in two rows and two columns share the FD portion 203 in each pixel 107, the FD portion 203 is arranged at a position adjacent to the four the photoelectric conversion elements 201. In one embodiment, to transfer the signal charge accumulated in the charge accumulation regions 210 to the FD portion 203 via the transfer gates 202 and convert the signal charge into voltage signals, the FD portion 203 is formed with the same conductivity type as that of the charge accumulation regions 210. The FD portion 203 is formed at a position overlapping at least a part of the first charge leak region 206 in the plan view from the first surface 207 side. To form the first charge leak region 206 and the FD portion 203 at different depths, the first charge leak region 206 is formed to avoid regions near the surface on which the FD portion 203 is formed. In other words, the first charge leak region 206 is formed at a second depth from the first surface 207, and the FD portion 203 is formed at a first depth shallower than the second depth from the first surface 207.

Through the above-described manufacturing process, a pixel structure including the first charge leak region 206 located at a depth different from the depth of the FD portion 203 is formed. The description about the above-described manufacturing process is the description about the pixel structure related to the first charge leak region 206. A structure and a manufacturing method of a neutral region in an interfacial region of the first surface 207 and the second surface 208 of the semiconductor substrate 209, and structures and manufacturing methods of the color filter 301 and the microlens 205 on the second surface 208 side are similar to known structures and methods, and the detailed description thereof will be omitted.

Figure 13:
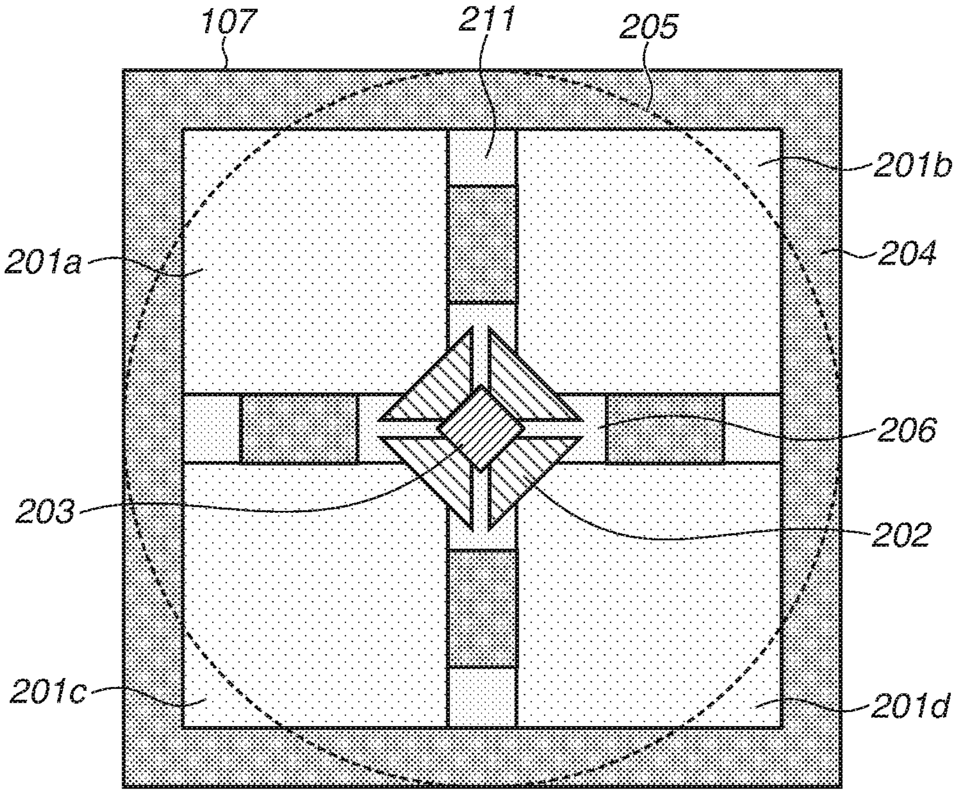
FIG. 13 is a plan view illustrating a photoelectric conversion apparatus according to a first modified example of the first exemplary embodiment.

A configuration of a photoelectric conversion apparatus according to a first modified example of the present exemplary embodiment will be described with reference to FIG. 13. Components similar to those in the present exemplary embodiment are assigned the same reference numerals, and the description of these components will sometimes be omitted or simplified. FIG. 13 is a plan view of each pixel 107 viewed from the first surface 207 side, similarly to FIG. 2.

FIG. 13 is an example of the plan view of each pixel 107 which is different from FIG. 2. This modified example differs from the present exemplary embodiment in the configuration of a charge leak region. As illustrated in FIG. 13, two types of charge leak regions (the first charge leak region 206 and a second charge leak region 211) are arranged in each pixel 107.

As illustrated in FIG. 13, the second charge leak region 211 is arranged between the photoelectric conversion elements 201 in the plan view from the first surface 207 side. The second charge leak region 211 is also arranged to be in contact with the photoelectric conversion elements 201. In the plan view from the first surface 207 side, the first charge leak region 206 is arranged at a position overlapping at least a part of the FD portion 203 belonging to the same pixel 107. On the other hand, in the plan view from the first surface 207 side, the second charge leak region 211 is arranged at a position not overlapping the FD portion 203 belonging to the same pixel 107. Furthermore, in the plan view from the first surface 207 side, the second charge leak region 211 is arranged at a position overlapping at least a part of the element isolation region 204. The second charge leak region 211 and the first charge leak region 206 are not in contact with each other. While the second charge leak region 211 is provided at a plurality of positions in FIG. 13, the second charge leak region 211 is provided at least at one position in the present modified example.

In the present modified example, in each pixel 107, in addition to the first charge leak region 206 arranged at a position overlapping the FD portion 203, the second charge leak region 211 is arranged at a position not overlapping the FD portion 203. This makes it easier to leak the signal charge between the photoelectric conversion elements 201, and the signal charge leaked and discharged to the FD portion 203 can be used as an image capturing signal. As compared with a case where a charge leak region is arranged only at a position not overlapping the FD portion 203, the signal charge can be leaked also in the diagonal direction. This makes it easy to leak the signal charge between the photoelectric conversion elements 201 before the signal charge leaks to the FD portion 203.

Figure 14:
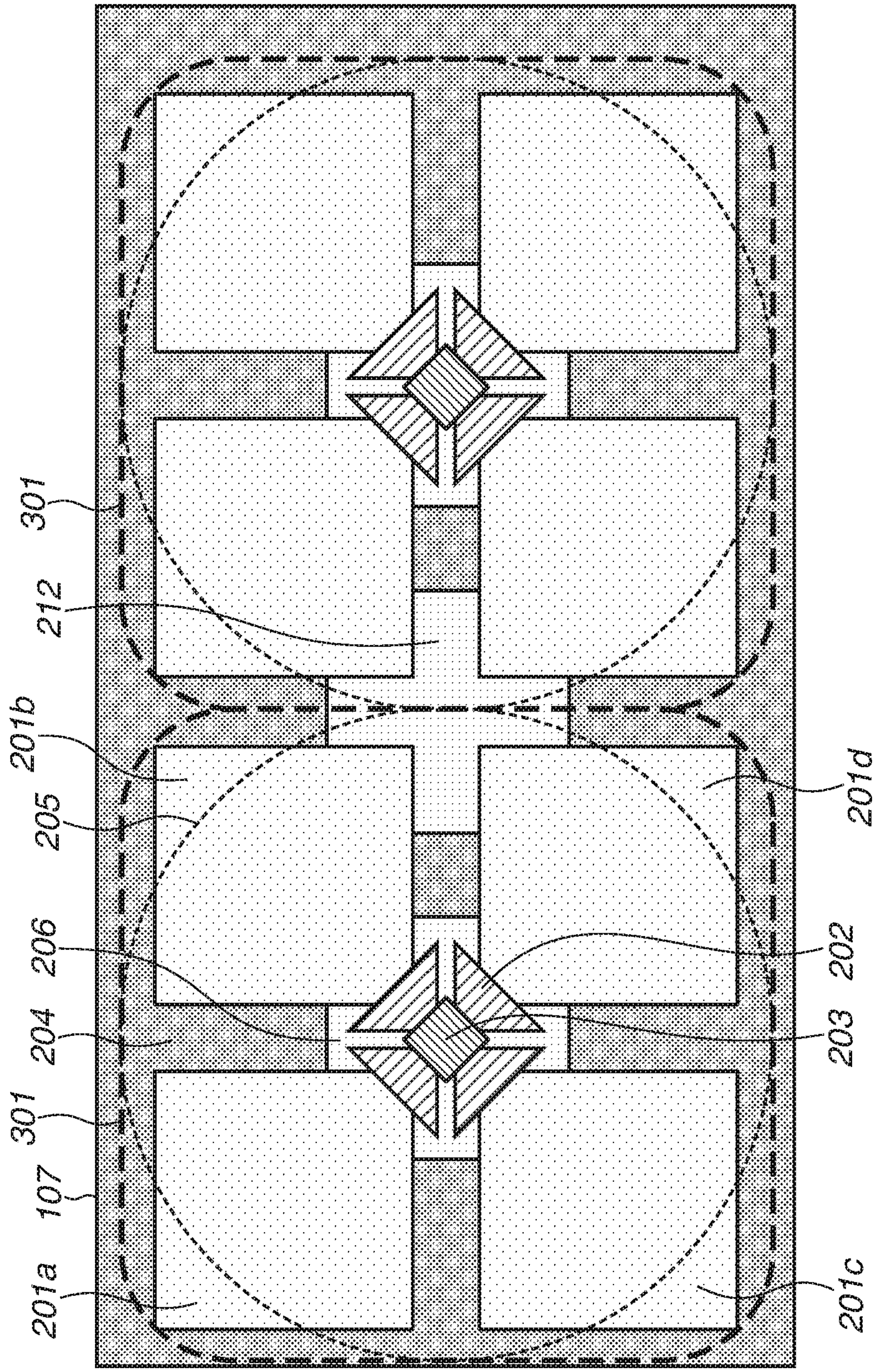
FIG. 14 is a plan view illustrating a photoelectric conversion apparatus according to a second modified example of the first exemplary embodiment.

A configuration of a photoelectric conversion apparatus according to a second modified example of the present exemplary embodiment will be described with reference to FIG. 14. Components similar to those in the present exemplary embodiment are assigned the same reference numerals, and the description of these components will sometimes be omitted or simplified. FIG. 14 is a plan view of each pixel 107 viewed from the first surface 207 side, similarly to FIG. 2.

FIG. 14 is an example of the plan view of each pixel 107 which is different from FIG. 2. This modified example differs from the present exemplary embodiment in the configuration of a charge leak region. As illustrated in FIG. 14, the first charge leak region 206 is arranged in each pixel 107, and a third charge leak region 212 is arranged between the plurality of pixels 107.

As illustrated in FIG. 14, the third charge leak region 212 is arranged between the photoelectric conversion elements 201 in the plan view from the first surface 207 side. The third charge leak region 212 is also arranged to be in contact with the photoelectric conversion elements 201. In the plan view from the first surface 207 side, the first charge leak region 206 is arranged at a position overlapping at least a part of the FD portion 203 belonging to the same pixel 107. On the other hand, in the plan view from the first surface 207 side, the third charge leak region 212 is arranged at a position not overlapping the FD portion 203 belonging to each pixel 107. The third charge leak region 212 is also arranged at a position overlapping at least a part of the element isolation region 204 in the plan view from the first surface 207 side. While the second charge leak region 211 according to the first modified example of the present exemplary embodiment is provided in each pixel 107, the third charge leak region 212 according to the present modified example is provided between the plurality of pixels 107.

In the plurality of pixels 107 illustrated in FIG. 14, the color filters 301 of the same color are respectively arranged. In other words, the third charge leak region 212 is arranged at a position overlapping the plurality of color filters 301 of the same color in the plan view from the first surface 207 side. Although not illustrated in FIG. 14, the color filters 301 of different colors can be arranged adjacent to each other. The microlens 205 can be arranged in each of the plurality of pixels 107.

In the present modified example, in addition to the first charge leak region 206 arranged between the photoelectric conversion elements 201 in each pixel 107, the third charge leak region 212 is arranged between the plurality of pixels 107 in which the color filters 301 of the same color are respectively arranged. In other words, in this configuration, the signal charge easily leaks via the charge leak regions (the first charge leak region 206 and the third charge leak region 212) not only between the photoelectric conversion elements 201 included in each pixel 107, but also between the photoelectric conversion elements 201 provided in the plurality of pixels 107 in which the color filters 301 of the same color are respectively arranged. Thus, in a case where the signal charge of any of the photoelectric conversion elements 201 is saturated, the signal charge is more likely to leak to another photoelectric conversion element 201 at which the color filter 301 of the same color is arranged, than to another photoelectric conversion element 201 at which the color filter 301 of a different color is arranged, whereby color mixture is suppressed. Also in a case where the third charge leak region 212 is arranged at a position that is between the pixels 107 in which the color filters 301 of the same color are respectively arranged and that does not overlap the FD portion 203, the third charge leak region 212 is arranged in a region deeper than the FD portion 203. By employing such a configuration, a charge leak region can be arranged without being significantly affected by a semiconductor element arranged on the first surface 207 side. Thus, the degree of layout freedom in arranging a semiconductor element in each pixel 107 improves.

Figure 15:
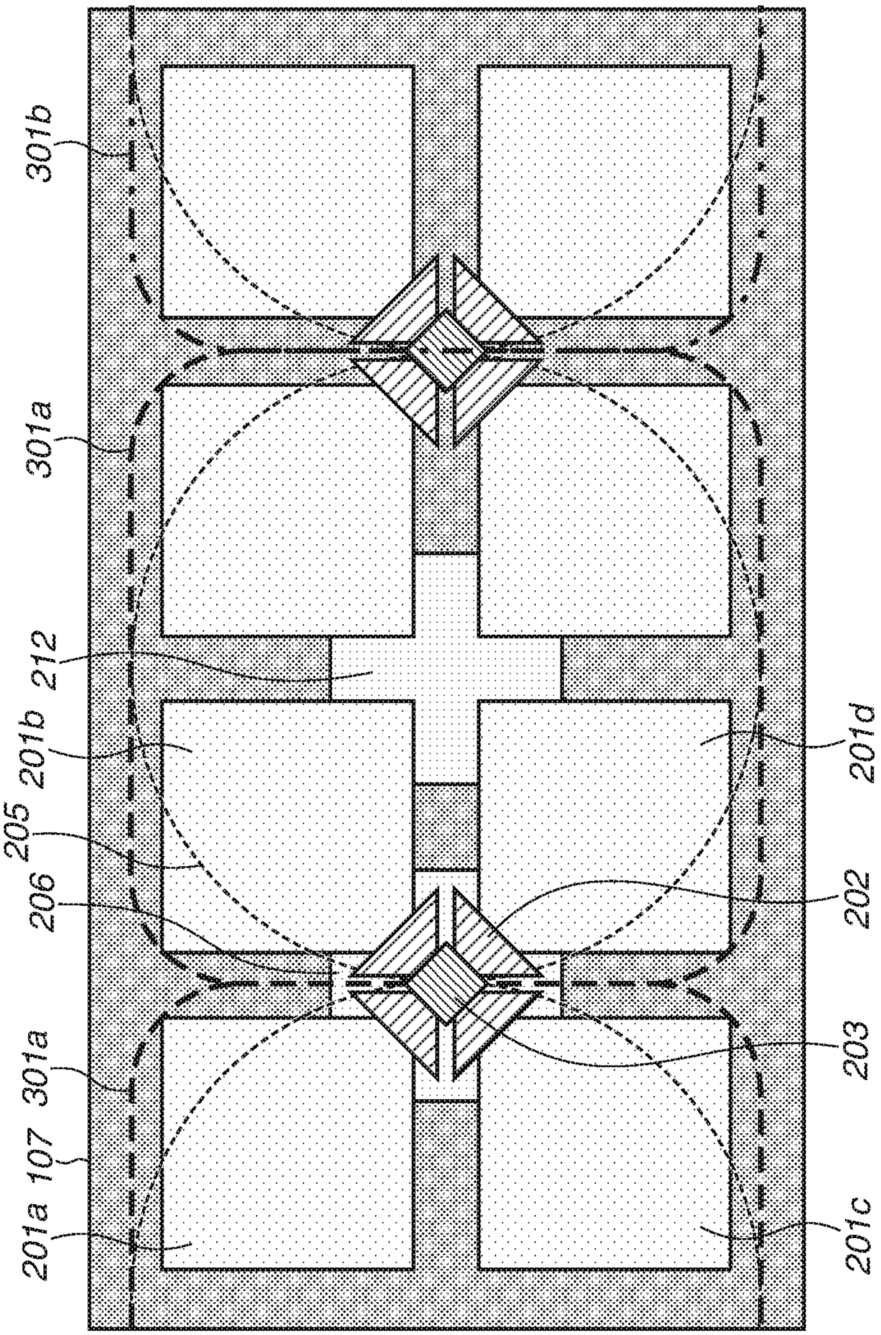
FIG. 15 is a plan view illustrating a photoelectric conversion apparatus according to a third modified example of the first exemplary embodiment.

A configuration of a photoelectric conversion apparatus according to a third modified example of the present exemplary embodiment will be described with reference to FIG. 15. Components similar to those in the first exemplary embodiment are assigned the same reference numerals, and the description of these components will sometimes be omitted or simplified. FIG. 15 is a plan view of each pixel 107 viewed from the first surface 207 side, similarly to FIG. 2.

FIG. 15 is an example of the plan view of each pixel 107 which is different from FIG. 2. This modified example differs from the present exemplary embodiment in the configuration of a charge leak region. The present modified example also differs from the second modified example of the present exemplary embodiment in the configurations of the microlens 205 and the color filter 301. As illustrated in FIG. 15, the first charge leak region 206 is provided in each pixel 107, and the third charge leak region 212 is arranged between the plurality of pixels 107.

As illustrated in FIG. 15, the third charge leak region 212 is arranged between the photoelectric conversion elements 201 in the plan view from the first surface 207 side. The third charge leak region 212 is also arranged to be in contact with the photoelectric conversion elements 201. In the plan view from the first surface 207 side, the first charge leak region 206 is arranged at a position overlapping at least a part of the FD portion 203 belonging to the same pixel 107. On the other hand, in the plan view from the first surface 207 side, the third charge leak region 212 is arranged at a position not overlapping the FD portion 203 belonging to each pixel 107. The third charge leak region 212 is also arranged at a position overlapping at least a part of the element isolation region 204 in the plan view from the first surface 207 side. While the second charge leak region 211 according to the first modified example of the present exemplary embodiment is provided in each pixel 107, the third charge leak region 212 according to the present modified example is provided between the plurality of pixels 107.

The color filters 301 (a color filter 301*a* and a color filter 301*b*) are each arranged to be shared between the plurality of pixels 107. In a case where the plurality of color filters 301*a* and 301*b* is generally described, the color filters 301*a* and 301*b* will be referred to as the color filters 301. The color filters 301*a* and 301*b* are different in color from each other. Each of the color filters 301 is shared by the photoelectric conversion elements 201 provided in different pixels 107 and adjacent to each other. In other words, the first charge leak region 206 is arranged at a position overlapping the plurality of color filters 301 of the same color in the plan view from the first surface 207 side. The microlens 205 can also be arranged. In this case, the microlens 205 can be shared by the plurality of pixels 107, or can be provided in each of the plurality of pixels 107.

In the present modified example, in addition to the first charge leak region 206 arranged between the photoelectric conversion elements 201 in each pixel 107, the third charge leak region 212 is arranged between the photoelectric conversion elements 201 sharing the color filter 301*a* in the plurality of pixels 107. In other words, in this configuration, the signal charge easily leaks via the charge leak regions (the first charge leak region 206 and the third charge leak region 212) not only between the photoelectric conversion elements 201 in each pixel 107, but also between the photoelectric conversion elements 201 in different pixels 107 at which the color filter 301*a* of the same color 107 is arranged. Thus, in a case where the signal charge of any of the photoelectric conversion elements 201 is saturated, the signal charge is more likely to leak to another photoelectric conversion element 201 at which the color filter 301*a* of the same color is arranged, than to another photoelectric conversion element 201 at which the color filter 301*b* of a different color is arranged, whereby color mixture is suppressed. Also in a case where the third charge leak region 212 is arranged at a position that is between the pixels 107 in which the color filter 301*a* of the same color is arranged and that does not overlap the FD portion 203, the third charge leak region 212 is arranged in a region deeper than the FD portion 203. By employing such a configuration, a charge leak region can be arranged without being significantly affected by a semiconductor element arranged on the first surface 207 side. Thus, the degree of layout freedom in arranging a semiconductor element in each pixel 107 improves.

Figure 16:
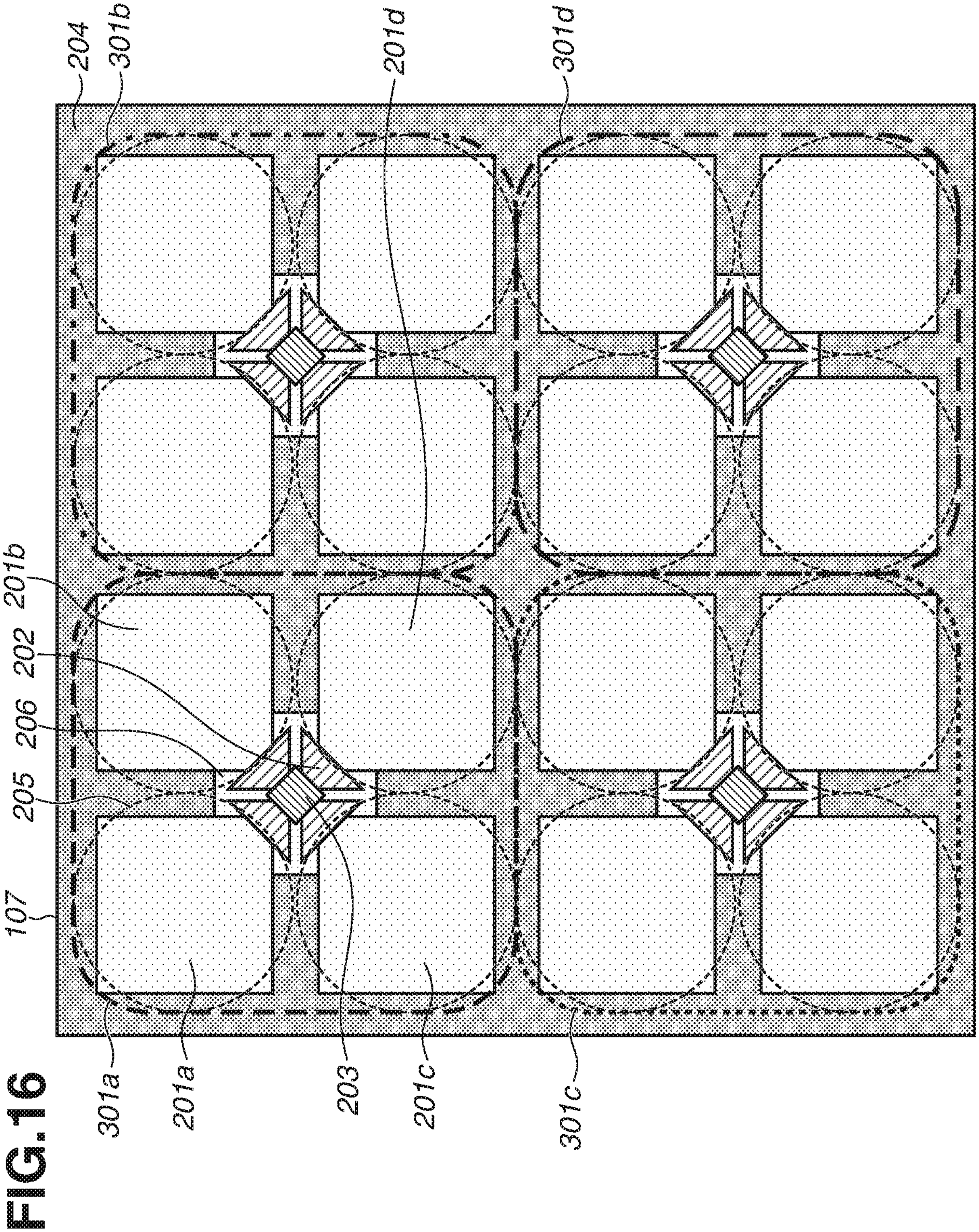
FIG. 16 is a plan view illustrating a photoelectric conversion apparatus according to a fourth modified example of the first exemplary embodiment.

A configuration of a photoelectric conversion apparatus according to a fourth modified example of the present exemplary embodiment will be described with reference to FIG. 16. Components similar to those in the present exemplary embodiment are assigned the same reference numerals, and the description of these components will sometimes be omitted or simplified. FIG. 16 is a plan view of each pixel 107 viewed from the first surface 207 side, similarly to FIG. 2.

FIG. 16 is an example of the plan view of each pixel 107 which is different from FIG. 2. This modified example differs from the present exemplary embodiment in the configuration of the microlens 205. As illustrated in FIG. 16, the microlens 205 is provided for each of the photoelectric conversion elements 201.

As illustrated in FIG. 16, in a configuration in which the pixel 107 illustrated in FIG. 2 is arranged in a plurality of rows and a plurality of columns, one color filter 301 is arranged to be shared among the plurality of photoelectric conversion elements 201 in each pixel 107. On the other hand, the microlens 205 is provided on the second surface 208 side for each of the plurality of photoelectric conversion elements 201. The arrangement of colors of the color filters 301 is a Bayer arrangement (in which a color filter 301*a* and a color filter 301*d* are green, a color filter 301*b* is red, and a color filter 301*c* is blue), for example. In a case where the plurality of color filters 301*a*, 301*b*, 301*c*, and 301*d* is generally described, the color filters 301*a*, 301*b*, 301*c*, and 301*d* will be referred to as the color filters 301. One color filter 301 may not necessarily be shared among the photoelectric conversion elements 201 in each pixel 107. For example, a plurality of the color filters 301 of the same color can be respectively provided for the photoelectric conversion elements 201 in each pixel 107.

In the present modified example, in a configuration in which the color filter 301 of the same color is provided for the plurality of photoelectric conversion elements 201 and the microlens 205 is provided for each of the plurality of photoelectric conversion elements 201, the first charge leak region 206 is arranged between the plurality of photoelectric conversion elements 201 provided with the color filter 301 of the same color. In other words, with this configuration, even in a case where the microlens 205 is not shared by the plurality of photoelectric conversion elements 201 provided with the color filter 301 of the same color, the signal charge easily leaks via the first charge leak region 206. Thus, in a case where the signal charge of any of the photoelectric conversion elements 201 is saturated, the signal charge is more likely to leak to another photoelectric conversion element 201 at which the color filter 301 of the same color is arranged, than to another photoelectric conversion element 201 at which the color filter 301 of a different color is arranged, whereby color mixture is suppressed. Furthermore, by arranging the first charge leak region 206 in a region deeper than the FD portion 203, the first charge leak region 206 can be arranged without being significantly affected by a semiconductor element arranged on the first surface 207 side. Thus, the degree of layout freedom in arranging a semiconductor element in each pixel 107 improves.

A configuration of a photoelectric conversion apparatus according to a second exemplary embodiment of the disclosure will be described with reference to FIG. 17.

Figure 17:
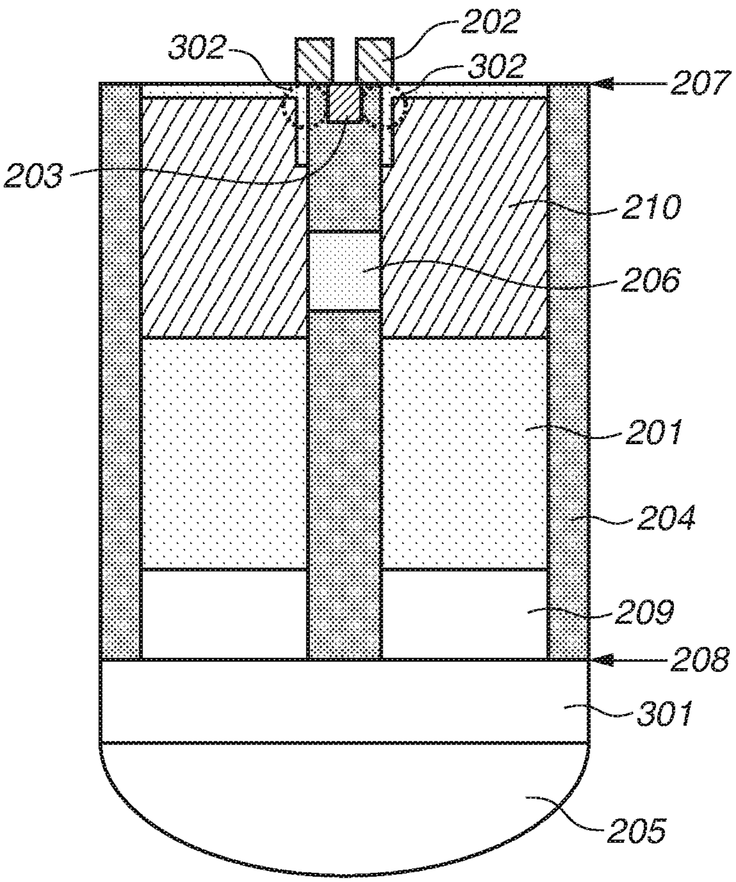
FIG. 17 is a cross-sectional view illustrating a photoelectric conversion apparatus according to a second exemplary embodiment.

FIG. 17 illustrates an example of the cross section A-B of each pixel 107 taken along the line A-B in the plan view of FIG. 2. Components similar to those in the first exemplary embodiment are assigned the same reference numerals, and the description of these components will sometimes be omitted or simplified.

The present exemplary embodiment differs from the first exemplary embodiment in the configuration of the first charge leak region 206. In FIG. 17, the element isolation region 204 includes the first charge leak region 206, and the element isolation region 204 and the first charge leak region 206 have the same conductivity type. On the other hand, similarly to the first exemplary embodiment, the height of the potential barrier of the first charge leak region 206 with respect to the signal charge is lower than the height of the potential barrier of the element isolation region 204 with respect to the signal charge.

In other words, in the present exemplary embodiment, the charge accumulation region 210 is of the first conductivity type, and the element isolation region 204 and the first charge leak region 206 are of the second conductivity type different from that of the charge accumulation region 210. An impurity concentration for making the first charge leak region 206 into a semiconductor region of the second conductivity type is lower than an impurity concentration for making the element isolation region 204 into a semiconductor region of the second conductivity type. For example, in a case where the signal charge is electrons, the charge accumulation region 210 is formed into an N-type region, and the element isolation region 204 and the first charge leak region 206 are formed into P-type regions.

The FD portion 203, a part of the element isolation region 204, the first charge leak region 206, and another part of the element isolation region 204 are arranged in order from the first surface 207 to the second surface 208. The first charge leak region 206 is not in contact with the FD portion 203.

As illustrated in the plan view of FIG. 2, also in the present exemplary embodiment, in the plan view from the first surface 207 side, the first charge leak region 206 is arranged at a position overlapping at least a part of the FD portion 203 belonging to the same pixel 107.

In the present exemplary embodiment, by adjusting the amount of dopant in ion implantation for forming the element isolation region 204, the first charge leak region 206 is arranged as a part of the element isolation region 204. In addition, as illustrated in FIG. 17, the first charge leak region 206 arranged at the second depth from the first surface 207 is at a position deeper from the first surface 207 than the FD portion 203 arranged at the first depth from the first surface 207. Thus, similarly to the first exemplary embodiment, by arranging the first charge leak region 206 at a position overlapping the FD portion 203, an increase in area of each pixel 107 can be suppressed.

Furthermore, as the number of the photoelectric conversion elements 201 sharing the first charge leak region 206 increases, the number of the first charge leak regions 206 to be arranged increases. Even in this case, in the present exemplary embodiment, the first charge leak regions 206 can be arranged without being significantly affected by a semiconductor element arranged on the first surface 207 side. Thus, the degree of layout freedom in arranging a semiconductor element in each pixel 107 improves.

As described above, according to the present exemplary embodiment, it is possible to obtain an appropriate signal while suppressing an increase in area of each pixel 107, by arranging the first charge leak region 206 for improving the linearity of the pixel input-output characteristic, at a position overlapping the FD portion 203. The second charge leak region 211 and the third charge leak region 212 described in the modified examples of the first exemplary embodiment can have a property similar to that of the first charge leak region 206 described in the present exemplary embodiment.

A configuration of a photoelectric conversion apparatus according to a third exemplary embodiment of the disclosure will be described with reference to FIG. 18.

Figure 18:
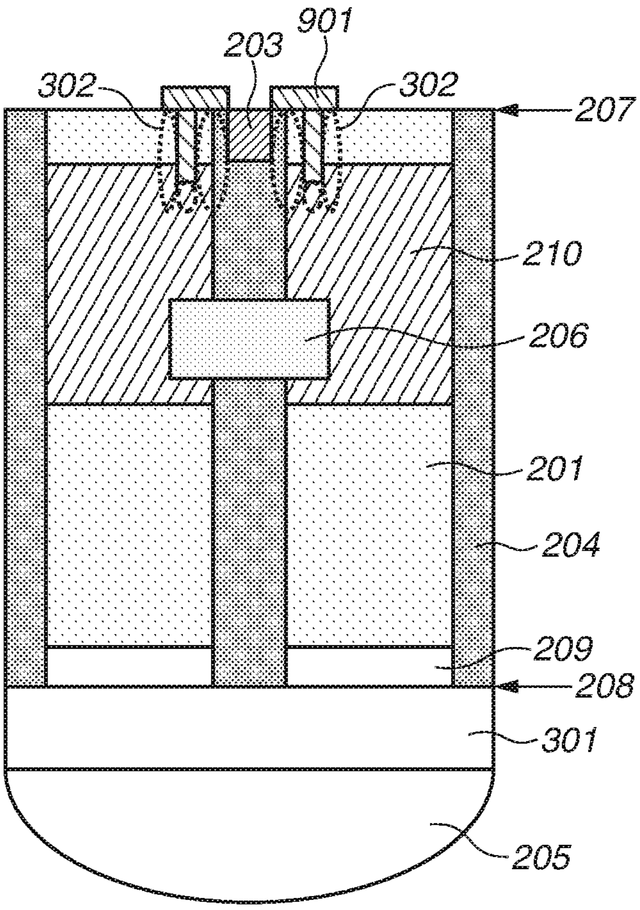
FIG. 18 is a cross-sectional view illustrating a photoelectric conversion apparatus according to a third exemplary embodiment.

FIG. 18 illustrates an example of the cross section A-B of each pixel 107 taken along the line A-B in the plan view of FIG. 2. Components similar to those in the first and second exemplary embodiments are assigned the same reference numerals, and the description of these components will sometimes be omitted or simplified.

The present exemplary embodiment differs from the first and second exemplary embodiments in the configuration of transfer gates. In FIG. 18, vertical transfer gates 901 are arranged as transfer gates. Compared with the first exemplary embodiment in which the transfer gates 202 in plane shape are arranged, arranging the vertical transfer gates 901 makes it possible to arrange the photoelectric conversion elements 201 at a deeper position from the first surface 207 in the depth direction of the semiconductor substrate 209. The vertical transfer gates 901 are each arranged on the first surface 207 so as to be adjacent to the corresponding photoelectric conversion element 201 and the FD portion 203, and extends from the first surface 207 to the second surface 208.

To avoid interference with a semiconductor element arranged on the first surface 207 side, such as the FD portion 203, the first charge leak region 206 is to be arranged at a depth different from that of the FD portion 203 or the like in the depth direction of the semiconductor substrate 209. In other words, the first charge leak region 206 arranged at the second depth from the first surface 207 is to be arranged at a position deeper from the first surface 207 than the FD portion 203 arranged at the first depth from the first surface 207. However, if the photoelectric conversion elements 201 do not exist at the depth at which the first charge leak region 206 is arranged, the first charge leak region 206 does not function as a leak pathway of signal charge.

Arranging the photoelectric conversion elements 201 at a deeper position using the vertical transfer gates 901 as in the present exemplary embodiment makes it also easier to arrange the first charge leak region 206 in a deep region distant from the first surface 207 side. This consequently reduces the possibility that a semiconductor element arranged on the first surface 207 side and the first charge leak region 206 can be made contact with each other due to a manufacturing variation, and the risk of malfunction of the photoelectric conversion apparatus can be reduced.

Figure 19:
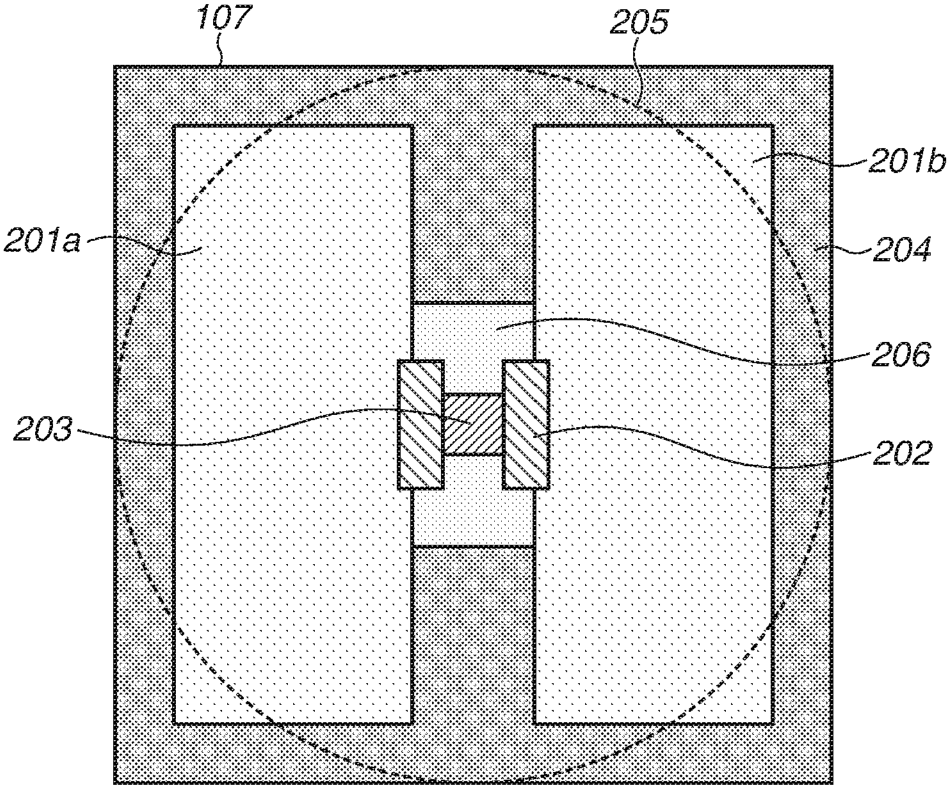
FIG. 19 is a plan view illustrating a photoelectric conversion apparatus according to a fourth exemplary embodiment.
Figure 20A:
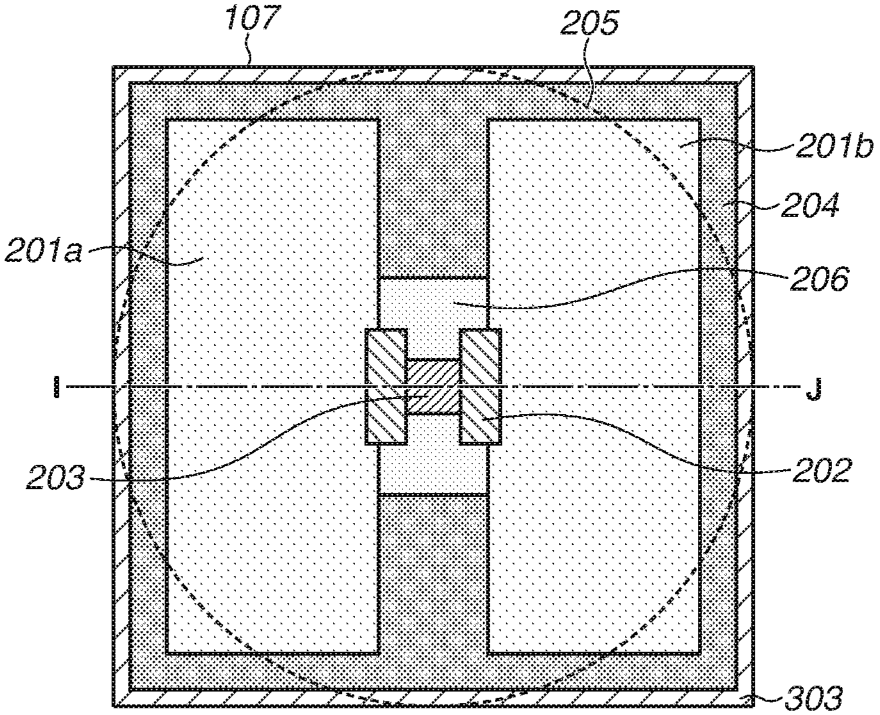
FIGS. 20A and 20B are other plan views illustrating the photoelectric conversion apparatus according to the fourth exemplary embodiment.
Figure 20B:
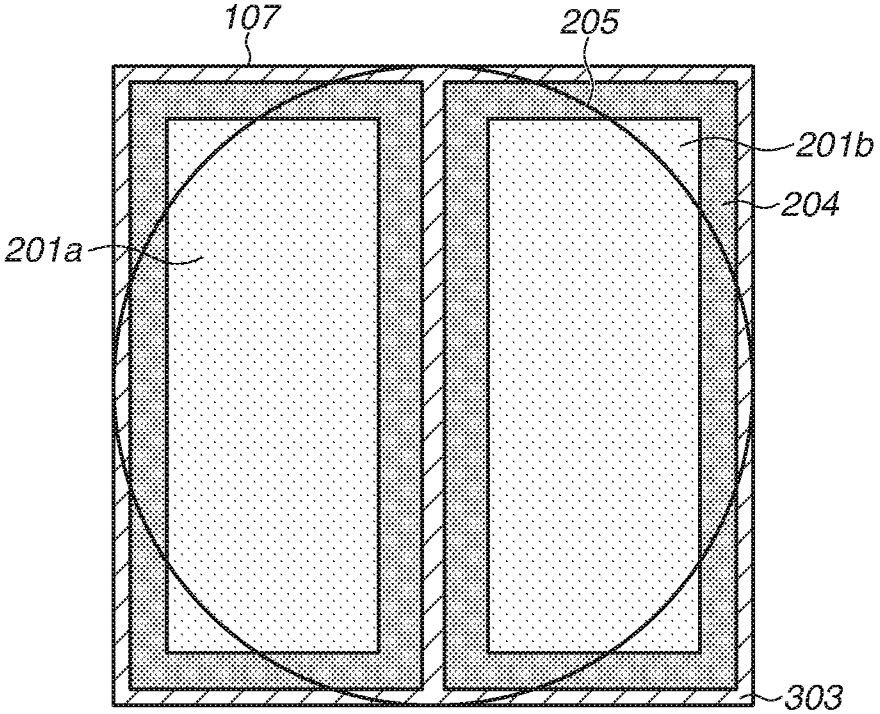

A configuration of a photoelectric conversion apparatus according to a fourth exemplary embodiment of the disclosure will be described with reference to FIGS. 19 to 21. Components similar to those in the first to third exemplary embodiments are assigned the same reference numerals, and the description of these components will sometimes be omitted or simplified. FIGS. 19 and 20A are plan views of each pixel 107 viewed from the first surface 207 side, similarly to FIG. 2. FIG. 20B is a plan view of each pixel 107 viewed from the second surface 208 side.

FIG. 19 is an example of the plan view of each pixel 107 which is different from FIG. 2. The present exemplary embodiment differs from the first to third exemplary embodiments in the configuration of the photoelectric conversion elements 201. As illustrated in FIG. 19, two photoelectric conversion elements 201*a* and 201*b* share the first charge leak region 206 and are arranged in one row and two columns.

As the number of the photoelectric conversion elements 201 included in each pixel 107 and sharing the first charge leak region 206 decreases, the area of the element isolation region 204 decreases and the area of the photoelectric conversion elements 201 increases accordingly.

Thus, the amount of light received by the photoelectric conversion elements 201 increases, and a saturation charge amount that can be accumulated in the photoelectric conversion elements 201 increases. Thus, the performance of the photoelectric conversion apparatus improves.

In FIG. 19, the photoelectric conversion elements 201 are arranged in one row and two columns. This arrangement can be rotated by 90 degrees or 45 degrees. By arranging the photoelectric conversion elements 201 in this manner, a phase difference detection direction of each pixel 107 can be changed.

Also in the present exemplary embodiment, the element isolation region 204 can include the trench structure 303 as illustrated in FIG. 3B. FIGS. 20A and 20B are plan views illustrating an example of each pixel 107 in which the element isolation region 204 includes the trench structure 303 in the configuration illustrated in FIG. 19. In FIG. 20B, the illustration of the semiconductor substrate 209 and the color filter 301 is omitted.

As illustrated in FIGS. 20A and 20B, the trench structure 303 is arranged inside the element isolation region 204 so as to surround the photoelectric conversion elements 201. In other words, the trench structure 303 is provided between the photoelectric conversion elements 201*a* and 201*b* that share the first charge leak region 206. The trench structure 303 is also provided between the photoelectric conversion elements 201 that do not share the first charge leak region 206. The trench structure 303 can contain at least either of insulating material and metal.

Figure 21:
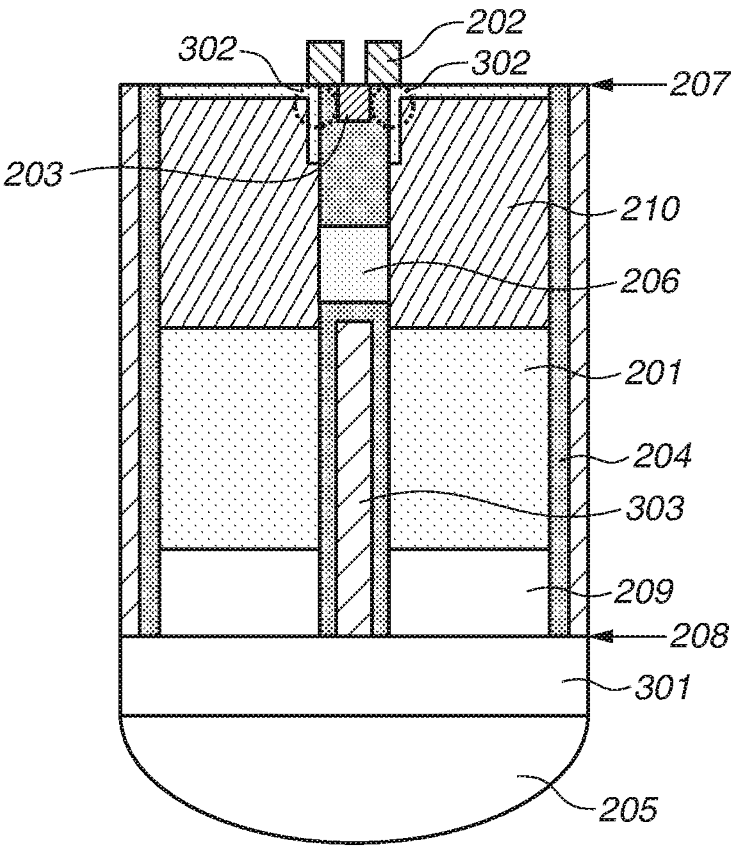
FIG. 21 is a cross-sectional view illustrating the photoelectric conversion apparatus according to the fourth exemplary embodiment.

FIG. 21 illustrates an example of a cross section I-J of each pixel 107 taken along a line I-J in the plan view of FIG. 20A.

As illustrated in FIG. 21, the element isolation region 204 arranged between the photoelectric conversion elements 201 that do not share the first charge leak region 206 includes the trench structure 303. The trench structure 303 is arranged to penetrate through the first surface 207 and the second surface 208.

The element isolation region 204 arranged between the photoelectric conversion elements 201*a* and 201*b* that share the first charge leak region 206 also includes the trench structure 303. For example, in a case where the signal charge is electrons, the element isolation region 204 is formed into a P-type region, and the trench structure 303 buried inside the element isolation region 204 exists up to the depth of the first charge leak region 206 from the second surface 208 on the light incidence side.

In other words, the FD portion 203, a part of the element isolation region 204, the first charge leak region 206, another part of the element isolation region 204, and the trench structure 303 are arranged in order from the first surface 207 to the second surface 208.

In this specification, specific arrangements of the photoelectric conversion elements 201, such as the two-row and two-column arrangement and the one-row and two-column arrangement, have been described. The number of the photoelectric conversion elements 201 that share the same microlens 205 can be changed for the purpose of improving phase difference detection accuracy. Alternatively, to enhance a binning function aimed at higher sensitivity, a configuration in which the number of the photoelectric conversion elements 201 that share the same color filter 301 is changed is also conceivable. Thus, the arrangement of the photoelectric conversion elements 201 is not limited to the one-row and two-column arrangement or the two-row and two-column arrangement.

Figure 22A:
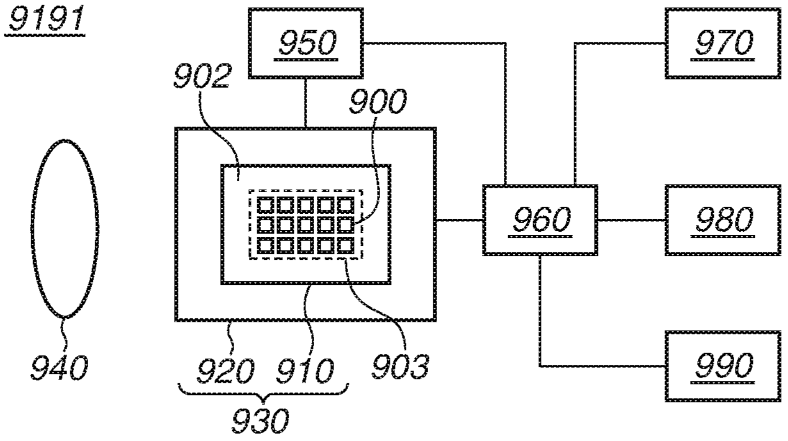
FIGS. 22A, 22B, and 22C are schematic diagrams illustrating equipment according to a fifth exemplary embodiment.

A fifth exemplary embodiment can be applied to any of the first to fourth exemplary embodiments. FIG. 22A is a schematic diagram illustrating equipment 9191 including a semiconductor apparatus 930 according to the present exemplary embodiment. As the semiconductor apparatus 930, the photoelectric conversion apparatus according to any of the above-described exemplary embodiments can be used. The equipment 9191 including the semiconductor apparatus 930 will be described in detail. The semiconductor apparatus 930 can include a semiconductor device 910. The semiconductor device 910 has a pixel area 903 in which pixel circuits 900 including photoelectric conversion units are arranged in a matrix. The semiconductor device 910 can have a peripheral area 902 around the pixel area 903. Circuits other than the pixel circuits 900 can be arranged in the peripheral area 902. The semiconductor apparatus 930 can include a package 920 accommodating the semiconductor device 910 in addition to the semiconductor device 910. The package 920 can include a base member to which the semiconductor device 910 is fixed, and a lid member, such as glass, that faces the semiconductor device 910. The package 920 can further include a bonding member, such as a bonding wire or a bump, that connects a terminal provided on the base member and a terminal provided on the semiconductor device 910.

The equipment 9191 can include at least one of an optical apparatus 940, a control apparatus 950, a processing apparatus 960, a display apparatus 970, a storage apparatus 980, and a mechanical apparatus 990. The optical apparatus 940 corresponds to the semiconductor apparatus 930. The optical apparatus 940 is, for example, a lens, a shutter, or a mirror, and includes an optical system that guides light to the semiconductor apparatus 930. The control apparatus 950 controls the semiconductor apparatus 930. The control apparatus 950 is a semiconductor apparatus such as an application specific integrated circuit (ASIC).

The processing apparatus 960 processes a signal output from the semiconductor apparatus 930. The processing apparatus 960 is a semiconductor apparatus, such as a central processing unit (CPU) or an ASIC, for forming an analog front end (AFE) or a digital front end (DFE). The display apparatus 970 is an electroluminescence (EL) display apparatus or a liquid crystal display apparatus that displays information (an image) obtained by the semiconductor apparatus 930. The storage apparatus 980 is a magnetic device or a semiconductor device that stores the information (the image) obtained by the semiconductor apparatus 930. The storage apparatus 980 is a volatile memory, such as a static random access memory (SRAM) or a dynamic RAM (DRAM), or a nonvolatile memory, such as a flash memory or a hard disc drive.

The mechanical apparatus 990 includes a movable unit or a drive unit, such as a motor or an engine. In the equipment 9191, a signal output from the semiconductor apparatus 930 is displayed on the display apparatus 970, or transmitted to an external apparatus by a communication apparatus (not illustrated) included in the equipment 9191. For this reason, in one embodiment, the equipment 9191 includes the storage apparatus 980 and the processing apparatus 960 aside from a storage circuit and a calculation circuit included in the semiconductor apparatus 930. The mechanical apparatus 990 can be controlled based on a signal output from the semiconductor apparatus 930.

The equipment 9191 is suitable for electronic equipment such as an information terminal (e.g., a smartphone or a wearable terminal) having an image capturing function, and a camera (e.g., an interchangeable lens camera, a compact camera, a video camera, or a monitoring camera). The mechanical apparatus 990 in a camera can drive components of the optical apparatus 940 for zooming, focusing, or a shutter operation. Alternatively, the mechanical apparatus 990 in a camera can move the semiconductor apparatus 930 for an antivibration operation.

The equipment 9191 can be transport equipment such as a vehicle, a vessel, or a flight body. The mechanical apparatus 990 in transport equipment can be used as a moving apparatus. The equipment 9191 serving as transport equipment is suitable as transport equipment that transports the semiconductor apparatus 930 or transport equipment that assists and/or automatizes driving (steering) using an image capturing function. The processing apparatus 960 for assisting and/or automatizing driving (steering) can perform processing for manipulating the mechanical apparatus 990 serving as a moving apparatus, based on the information obtained by the semiconductor apparatus 930. Alternatively, the equipment 9191 can be medical equipment such as an endoscope, measuring equipment such as a ranging sensor, analytical equipment such as an electronic microscope, office equipment such as a copier, or industrial equipment such as a robot.

According to the above-described exemplary embodiments, it is possible to obtain an excellent pixel characteristic. The value of a semiconductor apparatus can thus be enhanced. The enhancement of the value includes at least one of function addition, performance improvement, characteristic improvement, reliability improvement, manufacturing yield improvement, environment load reduction, cost reduction, downsizing, and weight saving.

Thus, using the semiconductor apparatus 930 according to the present exemplary embodiment in the equipment 9191 can also enhance the value of the equipment 9191. For example, by mounting the semiconductor apparatus 930 on transport equipment, excellent performance can be obtained in image capturing of the outside of the transport equipment and measurement of the external environment. When manufacturing and sale of transport equipment are performed, determining to mount the semiconductor apparatus 930 according to the present exemplary embodiment on the transport equipment is beneficial to enhancing the performance of the transport equipment. The semiconductor apparatus 930 is suitable especially for transport equipment that assists and/or automatizes driving of the transport equipment using information obtained by a semiconductor apparatus.

A photoelectric conversion system and a movable body according to the present exemplary embodiment will be described with reference to FIGS. 22B and 22C.

Figure 22B:
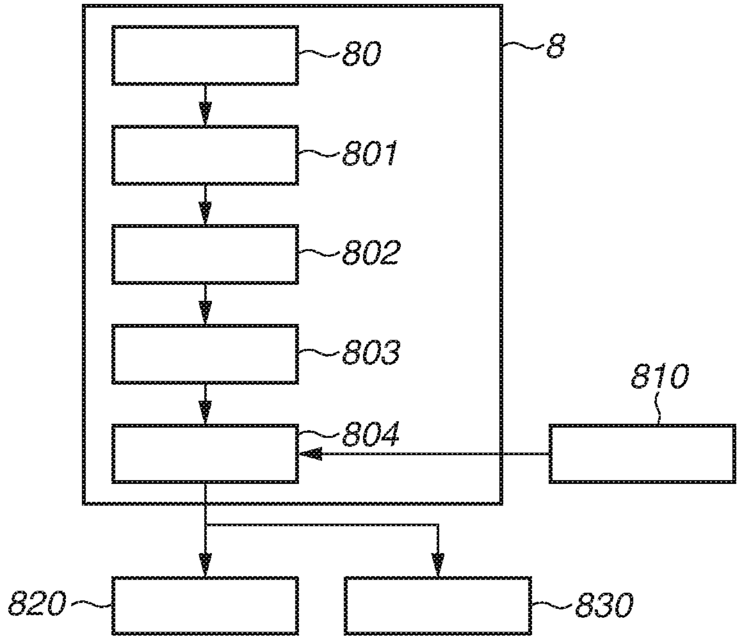

FIG. 22B illustrates an example of a photoelectric conversion system 8 related to an in-vehicle camera. The photoelectric conversion system 8 includes a photoelectric conversion apparatus 80. The photoelectric conversion apparatus 80 is the photoelectric conversion apparatus (the imaging apparatus) described in any of the above-described exemplary embodiments. The photoelectric conversion system 8 includes an image processing unit 801 that performs image processing on a plurality of pieces of image data acquired by the photoelectric conversion apparatus 80, and a parallax acquisition unit 802 that calculates a parallax (a phase difference between parallax images) from a plurality of pieces of image data acquired by the photoelectric conversion system 8. The photoelectric conversion system 8 also includes a distance acquisition unit 803 that calculates a distance to a target object based on the calculated parallax, and a collision determination unit 804 that determines whether there is a possibility of a collision based on the calculated distance. The parallax acquisition unit 802 and the distance acquisition unit 803 serve as examples of a distance information acquisition unit that acquires distance information regarding a distance to a target object. In other words, the distance information is information regarding a parallax, a defocus amount, and a distance to a target object. The collision determination unit 804 can determine a possibility of a collision using any of these pieces of distance information. The distance information acquisition unit can be implemented by specifically designed hardware, or can be implemented by a software module. Alternatively, the distance information acquisition unit can be implemented by a field programmable gate array (FPGA) or an ASIC, or can be implemented by a combination of these.

The photoelectric conversion system 8 is connected to a vehicle information acquisition apparatus 810, and can acquire vehicle information such as a vehicle speed, a yaw rate, and a steering angle. A control electronic control unit (ECU) 820 is also connected to the photoelectric conversion system 8. The control ECU 820 serves as a control apparatus that outputs, to a vehicle, a control signal for generating a braking force based on a determination result by the collision determination unit 804. The photoelectric conversion system 8 is also connected to an alarm apparatus 830 that raises an alarm to a driver based on a determination result by the collision determination unit 804. For example, if the determination result by the collision determination unit 804 indicates a high possibility of a collision, the control ECU 820 controls the vehicle to avoid a collision and reduce damage by braking, releasing an accelerator, or suppressing an engine output. The alarm apparatus 830 issues an alarm to a user by generating an alarm such as a sound, displaying warning information on a screen of a car navigation system, or vibrating a seatbelt or a steering wheel.

In the present exemplary embodiment, the photoelectric conversion system 8 captures an image of the surroundings of the vehicle, such as the front side or the rear side.

Figure 22C:
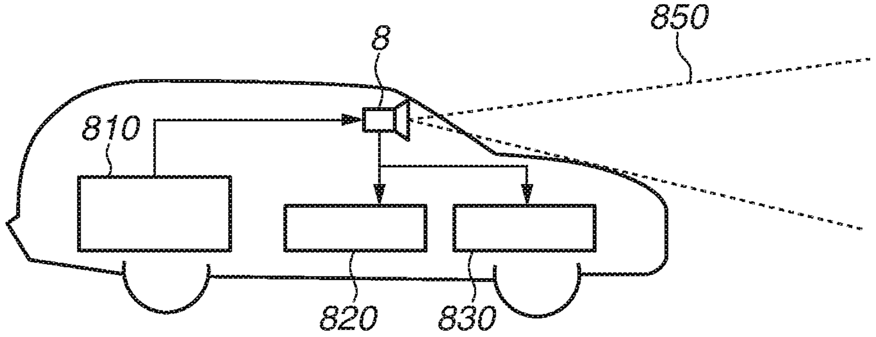

FIG. 22C illustrates the photoelectric conversion system 8 in a case where an image of the front of the vehicle (an imaging range 850) is captured. The vehicle information acquisition apparatus 810 issues an instruction to the photoelectric conversion system 8 or the photoelectric conversion apparatus 80. With such a configuration, the accuracy of distance measurement can be further enhanced.

While an example of the control to avoid a collision with another vehicle has been described above, the present exemplary embodiment can also be applied to the control to perform automatic driving by following another vehicle, and the control to perform automatic driving so as not to deviate from a lane. The photoelectric conversion system 8 can also be applied to a movable body (a moving apparatus) such as a vessel, an aircraft, or an industrial robot aside from a vehicle such as an automobile. The photoelectric conversion system 8 can further be applied to equipment that extensively uses object recognition, such as an intelligent transport system (ITS), in addition to a movable body.

The exemplary embodiments described above can be appropriately changed without departing from the technical idea of the disclosure. The disclosure in this specification includes not only the matters described in the specification but also all matters identifiable from the specification and the drawings attached to the specification. The disclosure in the specification also includes a complement of a concept described in the specification. More specifically, for example, in a case where the specification includes the description indicating that "A is larger than B", even if the description indicating that "A is not larger than B" is omitted, it can be said that the specification discloses that "A is not larger than B". This is because, in a case where the description indicating that "A is larger than B" is given, it is assumed that a case where "A is not larger than B" is considered.

According to the exemplary embodiments of the present disclosure, a photoelectric conversion apparatus having a configuration in which an increase in pixel area is suppressed can obtain an appropriate signal in a case where generated signal charge amounts vary between a plurality of photoelectric conversion elements.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2022-104632, filed Jun. 29, 2022, and No. 2023-064769, filed Apr. 12, 2023, which are hereby incorporated by reference herein in their entirety.

What is claimed is:

1. A photoelectric conversion apparatus comprising:

a pixel having a first surface and a second surface and including an array of a plurality of photoelectric conversion elements;

a plurality of charge accumulation regions each configured to accumulate signal charge, each of the plurality of charge accumulation regions being arranged in a different one of the plurality of photoelectric conversion elements;

a transfer gate arranged on the first surface and configured to transfer the signal charge output from at least a corresponding one of the plurality of photoelectric conversion elements;

a floating diffusion portion arranged between the plurality of photoelectric conversion elements in a plan view from a side of the first surface;

an element isolation region arranged between the plurality of photoelectric conversion elements in the plan view from the side of the first surface; and a first leak region arranged between the plurality of photoelectric conversion elements in the plan view from the side of the first surface, wherein the element isolation region and the first charge leak region have a conductivity type different from a conductivity type of the charge accumulation region, wherein an impurity concentration for making the first charge leak region into a region of the conductivity type different from the conductivity type of the charge accumulation region is lower than an impurity concentration for making the element isolation region into a region of the conductivity type different from the conductivity type of the charge accumulation region, wherein the floating diffusion portion is arranged at a first depth from the first surface, wherein the first charge leak region is arranged at a second depth deeper than the first depth from the first surface, and wherein, in the plan view from the side of the first surface, the first charge leak region is arranged at a position overlapping at least a part of the floating diffusion portion.

2. The photoelectric conversion apparatus according to claim 1, wherein a height of a potential barrier of the first charge leak region with respect to the signal charge is lower than a height of a potential barrier of the element isolation region with respect to the signal charge.

3. The photoelectric conversion apparatus according to claim 1, wherein the first charge leak region is not in contact with the floating diffusion portion.

4. The photoelectric conversion apparatus according to claim 1, wherein the floating diffusion portion, a part of the element isolation region, the first charge leak region, and another part of the element isolation region are arranged in order from the first surface to the second surface.

5. Equipment comprising:

the photoelectric conversion apparatus according to claim 1, wherein the equipment further comprises at least one of:

an optical apparatus configured to guide light to the photoelectric conversion apparatus;

a control apparatus configured to control the photoelectric conversion apparatus;

a processing apparatus configured to process a signal output from the photoelectric conversion apparatus;

a display apparatus configured to display information obtained by the photoelectric conversion apparatus;

a storage apparatus configured to store the information obtained by the photoelectric conversion apparatus; and a mechanical apparatus configured to operate based on the information obtained by the photoelectric conversion apparatus.

* * * * *